US011470191B2

(12) United States Patent
Choi et al.

(10) Patent No.: US 11,470,191 B2
(45) Date of Patent: Oct. 11, 2022

(54) ELECTRONIC DEVICE INCLUDING ROTATING OPTICAL MODULE

(71) Applicant: SAMSUNG ELECTRONICS CO., LTD., Suwon-si (KR)

(72) Inventors: Bongsuk Choi, Suwon-si (KR); Minsu Jung, Suwon-si (KR); Chulho Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 256 days.

(21) Appl. No.: 16/782,376

(22) Filed: Feb. 5, 2020

(65) Prior Publication Data

US 2020/0329130 A1 Oct. 15, 2020

(30) Foreign Application Priority Data

Apr. 9, 2019 (KR) .......................... 10-2019-0041244

(51) Int. Cl.
*H04N 5/225* (2006.01)
*H04M 1/02* (2006.01)
(Continued)

(52) U.S. Cl.
CPC .......... *H04M 1/0264* (2013.01); *G02B 7/023* (2013.01); *H04N 5/2252* (2013.01); *H05K 1/189* (2013.01); *H04N 5/2257* (2013.01)

(58) Field of Classification Search
CPC ............................ H04N 5/2257; H04M 1/0264
(Continued)

(56) References Cited

U.S. PATENT DOCUMENTS 7,782,375 B2 * 8/2010 Chambers .............. H04N 5/232
348/239
10,656,680 B2 * 5/2020 Fan ........................ G06F 1/1647
(Continued)

FOREIGN PATENT DOCUMENTS

EP 1744521 1/2007
EP 3651446 5/2020
(Continued)

OTHER PUBLICATIONS

European Search Report and Written Opinion dated May 17, 2021 in corresponding European Application No. 20787394.4.
(Continued)

*Primary Examiner* — Anthony J Daniels
(74) *Attorney, Agent, or Firm* — Nixon & Vanderhye, P.C.

(57) ABSTRACT

According to various embodiments disclosed herein, an electronic device may include: a first housing; a second housing coupled to the first housing and configured to slide in a first direction or a second direction opposite the first direction with respect to the first housing between a first position at which at least a portion of the second housing is accommodated in the first housing and a second position at which the second housing protrudes from the first housing; an optical module comprising optical circuitry mounted on the second housing, the optical module configured to be rotated in response to sliding of the second housing to be disposed to face a rear side of the first housing at the first position and to face a front side of the first housing at the second position; and an elastic member comprising a flexible elastic material accommodated in the second housing and configured to provide an elastic force to the optical module. The elastic member may provide the elastic force in a rotating direction of the optical module in a first operation in which the optical module rotates while moving from the
(Continued)

first position to the second position or in a second operation in which the optical module rotates while moving from the second position to the first position.

20 Claims, 15 Drawing Sheets

(51) Int. Cl.
*G02B 7/02* (2021.01)
*H05K 1/18* (2006.01)
(58) Field of Classification Search
USPC .................................................. 348/373, 376
See application file for complete search history.

(56) References Cited

U.S. PATENT DOCUMENTS

| 2004/0009790 | A1* | 1/2004 | Im | H04N 5/2259 |
| | | | | 455/556.1 |
| 2005/0013606 | A1 | 1/2005 | Yang et al. | |
| 2006/0197863 | A1 | 9/2006 | Kim | |
| 2007/0013555 | A1* | 1/2007 | Sung | H04M 1/0264 |
| | | | | 340/937 |
| 2011/0274422 | A1* | 11/2011 | Lin | H04N 5/2257 |
| | | | | 396/439 |
| 2020/0177715 | A1* | 6/2020 | Chen | H04M 1/0264 |
| 2020/0281083 | A1* | 9/2020 | Tang | H05K 5/0217 |
| 2020/0366851 | A1* | 11/2020 | Zhang | H04N 5/2257 |

FOREIGN PATENT DOCUMENTS

| KR | 10-0605842 | 8/2006 |
| KR | 10-0645159 | 11/2006 |
| KR | 10-2010-0002786 | 1/2010 |
| KR | 10-2010-0059166 | 6/2010 |
| KR | 10-2010-0111848 | 10/2010 |
| KR | 10-2011-0112957 | 10/2011 |

OTHER PUBLICATIONS

International Search Report and Written Opinion dated May 14, 2020 in counterpart International Application No. PCT/KR2020/001683.

\* cited by examiner

ELECTRONIC DEVICE INCLUDING ROTATING OPTICAL MODULE

CROSS-REFERENCE TO RELATED APPLICATION

This application is based on and claims priority under 35 U.S.C. § 119 to Korean Patent Application No. 10-2019-0041244, filed on Apr. 9, 2019, in the Korean Intellectual Property Office, the disclosure of which is incorporated by reference herein in its entirety.

BACKGROUND

Technical Field

The disclosure relates to an electronic device. For example, various embodiments relate to an electronic device including a rotating optical module.

Description of Related Art

As electronic, information, and communication technologies have developed, various functions are integrated into a single electronic device. For example, a smart phone includes functions of, for example, an audio 20 reproduction device, an imaging device, a digital diary, in addition to a communication function, and more various functions may be implemented in the smart phone through additional installation of applications. An electronic device may be provided with various pieces of information in real time by accessing a server or another electronic device in a wired or wireless manner as well as by executing an installed application or a stored file.

As it becomes more common to carry or use an electronic device such as a smart phone, user demand for the appearance of the electronic device is diversified. For example, in consideration of portability and ease of use, there is growing demand for an electronic device that is capable of providing a wider 30 screen while the device itself is miniaturized. By mounting a display having a screen display area close to 100% of the front area of the housing of an electronic device, user demand for portability and ease of use may be satisfied.

However, it may be difficult to sufficiently secure a screen display area on the front face of the housing of an electronic device. For example, an optical module for video calling, selfie photographing, iris recognition, or face recognition may be placed on the front face of an electronic device, and the arrangement space of the optical module or the optical path to the optical module may be an obstacle to securing a screen display area.

SUMMARY

Embodiments of the disclosure provide an electronic device including an optical module that performs a stable rotation operation.

According to various example embodiments disclosed herein, an electronic device may include: a first housing; a second housing coupled to the first housing and configured to slide in a first direction and/or in a second direction opposite the first direction with respect to the first housing between a first position at which at least a portion of the second housing is accommodated in the first housing and a second position at which the second housing protrudes from the first housing; an optical module comprising optical circuitry mounted on the second housing, the optical module configured to rotate in response to sliding of the second housing so as to be disposed to face a rear side of the first housing at the first position and to face a front side of the first housing at the second position; and an elastic member comprising a flexible elastic material accommodated in the second housing and configured to provide an elastic force to the optical module. The elastic member may provide the elastic force in a rotating direction of the optical module in a first operation in which the optical module rotates while moving from the first position to the second position or in a second operation in which the optical module rotates while moving from the 30 second position to the first position.

According to various example embodiments disclosed herein, an electronic device may include: a first housing having a display mounted to face a front face thereof; a second housing coupled to the first housing and configured to slide in a first direction or a second direction opposite the first direction with respect to the first housing between a first position at which at least a portion of the second housing is accommodated in the first housing and a second position at which the second housing protrudes from the first housing; an optical module comprising optical circuitry mounted on the second housing and configured to rotate in response to sliding of the second housing causing the optical module to face the rear side of the first housing at the first position and to be disposed parallel to the display to face the front side of the first housing at the second position, the optical module including a case at least partially exposed outward of the second housing, rotating shafts extending from both ends of the case, the case and the rotating shafts being rotatably mounted in the second housing; and a flexible printed circuit board. The flexible printed circuit board may include a first connector disposed inside the case, a first extension extending from the first connector and disposed inside the rotating shaft, and a second extension extending from one side of the first extension, at least a portion of the second extension being arranged around the rotating shaft. When the second housing slides from the second position to the first position, the second extension may provide an elastic force in a rotating direction of the optical module.

According to various example embodiments disclosed herein, it is possible to form the screen display area to substantially correspond to the entire front area of the housing by including the rotating optical module capable of being disposed to face the front side as needed. According to various embodiments, it is convenient to use the optical module since the rotation of the optical module is interlocked with the appearing/disappearing operation of the second housing by a gear structure (e.g., the structure in which the rack gear and the pinion gear are combined). In another embodiment, since an elastic force is provided in the rotating operation of the optical module, the appearing/disappearing operation of the second housing and the rotation of the optical module are capable of being accurately interlocked, even if there is a backlash between the gears.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
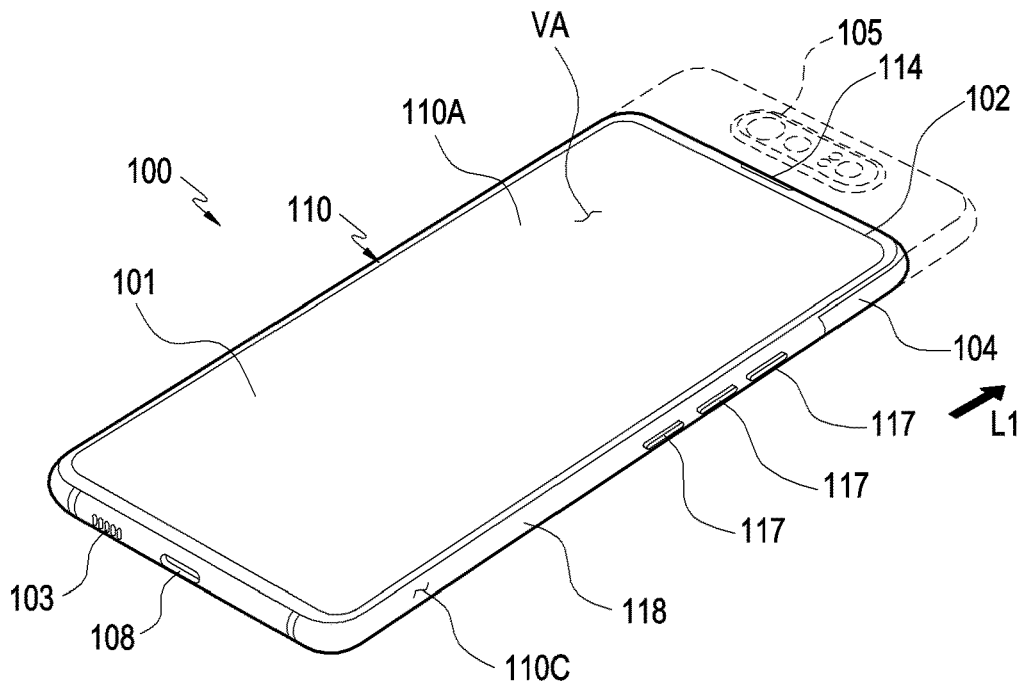
FIG. 1 is a front perspective view illustrating an example electronic device according to various embodiments.

As the disclosure allows for various changes and numerous embodiments, various example embodiments will be described in greater detail with reference to the accompanying drawings. However, it should be understood that the disclosure is not limited to the specific embodiments, and that the disclosure includes all modifications, equivalents, and alternatives within the spirit and the scope of the disclosure.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Although ordinal terms such as "first" and "second" may be used to describe various elements, these elements are not limited by the terms. The terms are used merely to distinguish an element from the other elements. For example, a first element could be termed a second element, and similarly, a second element could be also termed a first element without departing from the scope of the disclosure. As used herein, the term "and/or" includes any and all combinations of one or more associated items. It is to be understood that if an element (e.g., a first element) is referred to, with or without the term "operatively" or "communicatively", as "coupled with," or "connected with,", the element may be coupled with the other element directly (e.g., wiredly), wirelessly, or via a third element.

Further, the relative terms "a front surface", "a rear surface", "a top surface", "a bottom surface", and the like which are described with respect to the orientation in the drawings may be replaced by ordinal numbers such as first and second. In the ordinal numbers such as first and second, their order are determined in the mentioned order or arbitrarily.

In the disclosure, the terms are used to describe specific embodiments, and are not intended to limit the disclosure. As used herein, the singular forms are intended to include the plural forms as well, unless the context clearly indicates otherwise. In the disclosure, the terms such as "include" and/or "have" may be understood to denote a certain characteristic, number, step, operation, constituent element, component or a combination thereof, but may not be construed to exclude the existence of or a possibility of addition of one or more other characteristics, numbers, steps, operations, elements, components or combinations thereof.

Unless defined differently, all terms used herein, which include technical terminologies or scientific terminologies, have the same meaning as that understood by a person skilled in the art to which the disclosure belongs. Such terms as those defined in a generally used dictionary are to be interpreted to have the meanings equal to the contextual meanings in the relevant field of art, and are not to be interpreted to have ideal or excessively formal meanings unless clearly defined in the disclosure.

In the disclosure, an electronic device may be a random device, and the electronic device may be called a terminal, a portable terminal, a mobile terminal, a communication terminal, a portable communication terminal, a portable mobile terminal, a touch screen or the like.

For example, the electronic device may, for example, and without limitation, be a smartphone, a portable phone, a game player, a TV, a display unit, a heads-up display unit for a vehicle, a notebook computer, a laptop computer, a tablet Personal Computer (PC), a Personal Media Player (PMP), a Personal Digital Assistants (PDA), and the like. The electronic device may be implemented as a portable communication terminal which has a wireless communication function and a pocket size. Further, the electronic device may be a flexible device or a flexible display device. However, the disclosure is not limited thereto.

The electronic device may communicate with an external electronic device, such as a server or the like, or perform an operation through an interworking with the external electronic device. For example, the electronic device may transmit an image photographed by a camera and/or position information detected by a sensor unit to the server through a network. The network may be a mobile or cellular communication network, a Local Area Network (LAN), a Wireless Local Area Network (WLAN), a Wide Area Network (WAN), an Internet, a Small Area Network (SAN) or the like, but is not limited thereto.

Figure 2:
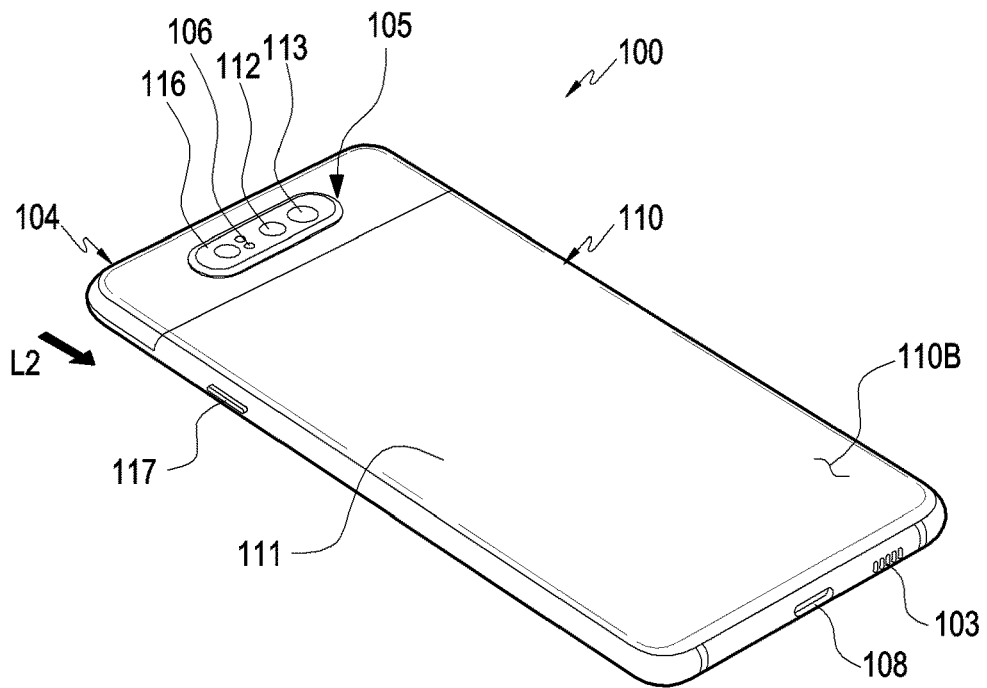
FIG. 2 is a rear perspective view illustrating the rear face of the example electronic device according to various embodiments.

FIG. 1 is a front perspective view illustrating an example electronic device 100 according to various embodiments. FIG. 2 is a rear perspective view illustrating the rear face of the example electronic device 100 according to various embodiments.

Referring to FIGS. 1 and 2, an electronic device 100 according to an embodiment may include: a first housing 110 including a first face (or a front face) 110A, a second face (or a rear face) 110B, and a side face 110C (or a side wall) surrounding the space between the first face 110A and the second face 110B. In another embodiment (not illustrated), the term "first housing 110" may refer to a structure forming a part of the first face 110A, the second face 110B, and the side face 110C in FIG. 1. In still another embodiment, the electronic device 100 may include a second housing 104 slidably coupled to the first housing 110 and an optical module 105 rotatably coupled to the second housing 104.

According to an embodiment, at least a portion of the first face 110A may be formed of a substantially transparent front plate 102 (e.g., a glass plate or a polymer plate including various coating layers). According to an embodiment, the front plate 102 may include a curved portion extending seamlessly from the first face 110A towards the rear plate 111 in at least one side edge portion.

According to various embodiments, the second face 110B may be formed by a substantially opaque rear plate 111. The rear plate 111 may be formed of, for example, coated or colored glass, ceramic, polymer, or metal (e.g., aluminum, stainless steel (STS), or magnesium), or a combination of two or more of these materials. According to an embodiment, the rear plate 111 may include a curved portion extending seamlessly from the second face 110B towards the front plate 102 in at least one side edge portion.

According to various embodiments, the side face 110C may be formed by a side structure (a side member or a side wall) 118 coupled to the front plate 102 and the rear plate 111 and including metal and/or polymer. In some embodiments, the rear plate 111 and the side structure 118 may be integrally formed, and may include the same material (e.g., a metal material such as aluminum).

According to an embodiment, the electronic device 100 may include at least one of a display 101, audio modules 103 and 114, a sensor module (not illustrated), key input devices 117, and a connector hole 108. In some embodiments, in the electronic device 100, at least one of the components (e.g., the key input devices 117) may be omitted, or other components may be additionally included. For example, the electronic device 100 may include a sensor module (not illustrated). For example, in an area provided by the front plate 102, a sensor, such as a proximity sensor or an illuminance sensor, may be integrated into the display 101 or disposed at a location adjacent to the display 101. In some embodiments, the electronic device 100 may further include a light-emitting element, and the light-emitting device may be disposed at a position adjacent to the display 101 in the area provided by the front plate 102. The light-emitting element may provide, for example, the status information of the electronic device 100 in an optical form. In another embodiment, the light-emitting element may provide a light source that is interlocked with, for example, the operation of the camera module. The light-emitting element may include, for example, an LED, an IR LED, and a xenon lamp.

The display 101 may be exposed through, for example, a large portion of the front plate 102. In some embodiments, the edges of the display 101 may be formed to be substantially the same as the contour shape of the front plate 102 adjacent thereto. In another embodiment (not illustrated), the distance between the outer edges of the display 101 and the outer edges of the front plate 102 may be substantially constant in order to enlarge the exposed area of the display 101. For example, when viewed from above the front plate 102, the area of the screen display area VA of the display 101 may be 90% or more (substantially 100%) of the area of the first face 110A. In another embodiment (not illustrated), a recess or an opening may be formed in a part of the screen display area VA of the display 101, and another electronic component aligned with the recess or the opening, such as a camera module, a proximity sensor (not illustrated), or an illuminance sensor may be included.

In another embodiment (not illustrated), at least one of camera modules 112 and 113, a fingerprint sensor, an infrared projector 116, and a light-emitting element (e.g., a flash 106) may be included on the rear side of the screen display area VA of the display 101. In another embodiment (not illustrated), the display 101 may be coupled to or disposed adjacent to a touch-sensitive circuit, a pressure sensor that is capable of measuring the intensity (pressure) of touch, and/or a digitizer that detects a magnetic-field-type stylus pen.

The audio modules 103 and 114 may include a microphone hole and a speaker hole. The microphone hole may include a microphone disposed therein so as to acquire external sound. In some embodiments, multiple microphones may be disposed in the microphone hole so as to detect the direction of sound. In some embodiments, the speaker hole and the microphone hole may be implemented as a single hole, or a speaker (e.g., a piezo speaker) may be included without a speaker hole. The speaker hole may include an external speaker hole and a phone call receiver hole 114.

By including a sensor module (not illustrated), the electronic device 100 may generate an electrical signal or data value corresponding to an internal operating state or an external environmental condition. The sensor module may further include, for example, a proximity sensor disposed on the first face 110a of the first housing 110, a fingerprint sensor incorporated in the display 101, and/or a biometric sensor (e.g., an HRM sensor) disposed on the second face 110B of the first housing 110. The electronic device 100 may further include at least one of sensor modules (not illustrated in the drawings), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illuminance sensor.

The camera modules 112, 113 may include a first camera device (not illustrated) disposed on the first face 110A of the electronic device 100, and second camera devices 112 and 113 disposed on the second face 110B, and/or a flash 106. The camera devices 112 and 113 may include one or more lenses, an image sensor, and/or an image signal processor. The flash 106 may include, for example, a light-emitting diode or a xenon lamp. In some embodiments, two or more lenses (e.g., an infrared camera lens, a wide-angle lens, and a telephoto lens) and image sensors may be disposed on one face of the electronic device 100.

The key input devices 117 may be disposed on the side face 110C of the first housing 110. In another embodiment, the electronic device 100 may not include some or all of the above-mentioned key input devices 117, and a key input device 117, which is not included therein, may be implemented in another form of a soft key or the like on the display 101. In some embodiments, the key input devices may include a fingerprint sensor disposed on the second face 110B of the first housing 110.

The connector hole 108 may accommodate a connector configured to transmit and receive power and/or data to and from an external electronic device and a connector configured to transmit and receive an audio signal to and from an external electronic device. For example, the connector hole 108 may include a USB connector or an earphone jack.

According to various embodiments, the second housing 104 may slide between, for example, a first position (e.g., the position illustrated in FIG. 3 or 4 or the first position P1 in FIG. 7) at which the second housing 104 is accommodated in the first housing 110 and a second position (e.g., the position illustrated in FIG. 5 or 6 or the second position P2 in FIG. 7) at which the second housing 104 protrudes from the first housing. For example, the second housing 104 may slide in a first direction L1 to protrude from the first housing 110, and may slide in a reverse direction of the first direction L1 (hereinafter, referred to as "second direction L2") so as to be accommodated in the first housing 110. In an embodiment, the optical module 105 is rotatably coupled to the second housing 104 so as to face the rear side of the first housing 110 at the first position P1 or so as to face the front side of the first housing 110 at the second position P2. In the following detailed description, the "optical module facing direction" may mean a direction in which electronic components (e.g., the cameras 112 and 113, the infrared projector 116, the light-emitting elements (flash 106) or illuminance sensors embedded in the optical module) are oriented for photographing or a light-emitting direction.

According to various embodiments, when the optical module 105 includes a camera, a subject may be photographed in a direction opposite the direction in which the display 101 outputs a screen at the first position P1, and a subject may be photographed in a direction substantially the same as the direction in which the display 101 outputs a screen at the second position P2. According to an embodiment, at the first position P1, the second housing 104 or the optical module 105 may be covered by the screen display area VA of the display 101. For example, when located at the first position P1, the second housing 104 or the optical module 105 may be concealed on the front side of the first housing 110. In another embodiment, even when located at the first position P1, the second housing 104 or the optical module 105 may be at least partially exposed on the rear side of the first housing 110. According to another embodiment, when located at the second position P2, the second housing 104 is protruded from one side (e.g., the upper end) of the first housing 110, and the optical module 105 may rotate so as to be exposed to the front side of the first housing 110. For example, at the second position P2, the optical module 105 may photograph a subject in a direction substantially the same as the direction in which the display 101 outputs a screen, or may recognize the user's iris or face.

According to various embodiments, the optical module 105 may include an infrared projector 116 or a light-emitting element (e.g., a flash 106) interlocked with the cameras 112 and 113. The infrared projector 116 or the light-emitting element 106 may be linked with the cameras 112 and 113 so as to detect the depth of a subject or to illuminate the subject.

According to an embodiment, the optical module 105 may include an illuminance sensor. The illuminance sensor may detect a usage environment of the electronic device 100, for example, the brightness of surroundings, and the electronic device 100 (e.g., a processor) may adjust the brightness of the display 101 on the basis of information detected by the illumination sensor. In some embodiments, regardless of the position of the second housing 104 (e.g., the first position P1 or the second position P2), the cameras 112 and 113, the infrared projector 116, the light-emitting element, or the illumination sensor mounted on the optical module 105 may maintain the state optically exposed to the external environment. According to various embodiments, at the first position P1, the cameras 112 and 113, the infrared projector 116, the light-emitting element, or the illumination sensor mounted on the optical module 105 may be disposed to be oriented in a direction opposite the direction in which the display 101 outputs a screen, and at the second position P2, the cameras 112 and 113, the infrared projector 116, the light-emitting element, or the illumination sensor mounted on the optical module 105 may be disposed to be oriented in a direction substantially the same as the direction in which the display 101 outputs a screen.

Figure 3:
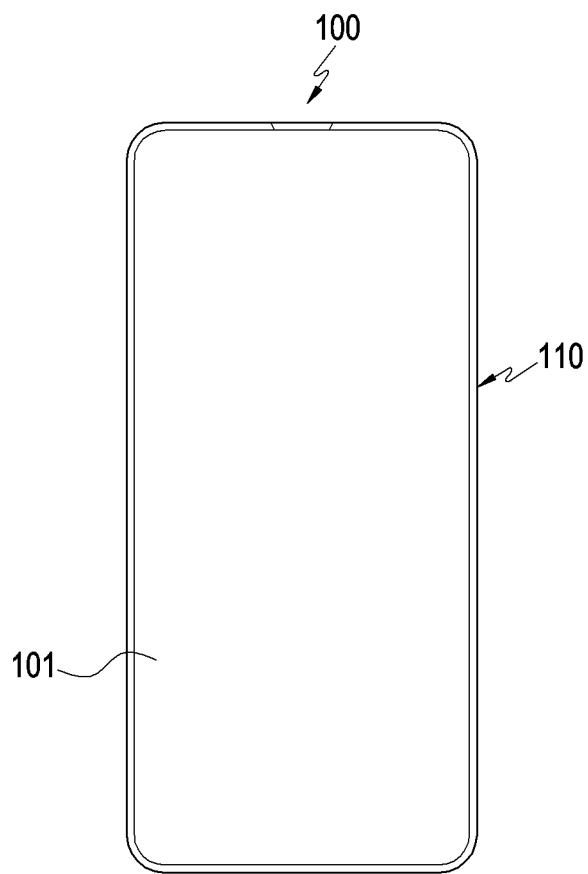
FIG. 3 is a front view illustrating the example electronic device in the state in which a second housing is accommodated in a first housing according to various embodiments.
Figure 4:
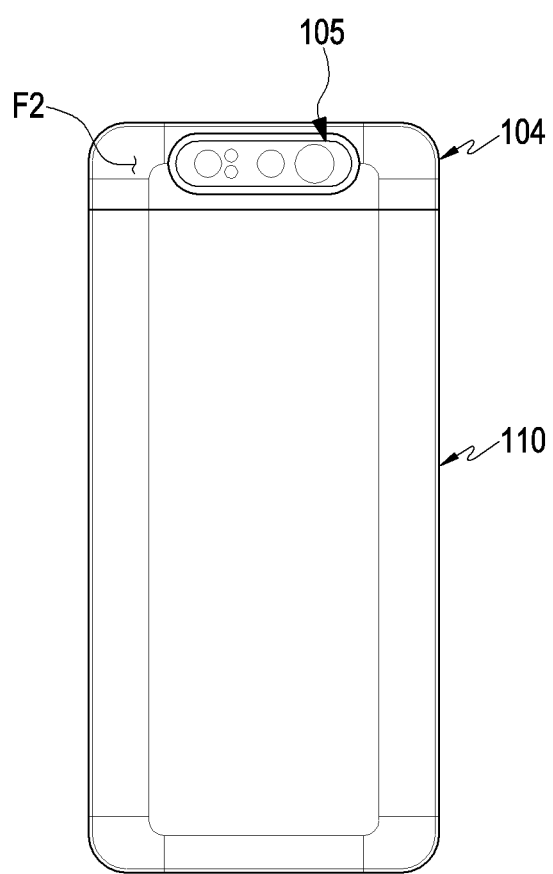
FIG. 4 is a rear view illustrating the example electronic device in the state in which a second housing is accommodated in a first housing according to various embodiments.

FIG. 3 is a front view illustrating the example electronic device 100 according to various embodiments in the state in which the second housing 104 is accommodated in the first housing 110. FIG. 4 is a rear view illustrating the example electronic device 100 according to various embodiments in the state in which the second housing 104 is accommodated in the first housing 110.

Referring to FIG. 3, at the first position (e.g., the first position P1 in FIG. 7), for example, in the state in which the second housing 104 is accommodated in the first housing 110, the second housing 104 or the optical module 105 may be at least partially concealed by the first housing 110 or the display 101. For example, when viewed from the front of the electronic device 100, the second housing 104 or the optical module 105 may be concealed. Referring to FIG. 4, even when the second housing 104 is accommodated in the first housing 110, at least a portion of the second housing 104 or the optical module 105 may be exposed to the outside on the rear side of the electronic device 100. For example, at the first position P1, the front face of the second housing 110 (e.g., the front face F1 in FIG. 5) is concealed by the display 101 and the rear face of the second housing 104 (e.g., the rear face F2 in FIG. 4 or 6) may be exposed to the rear side of the electronic device 100.

Figures 5, 6:
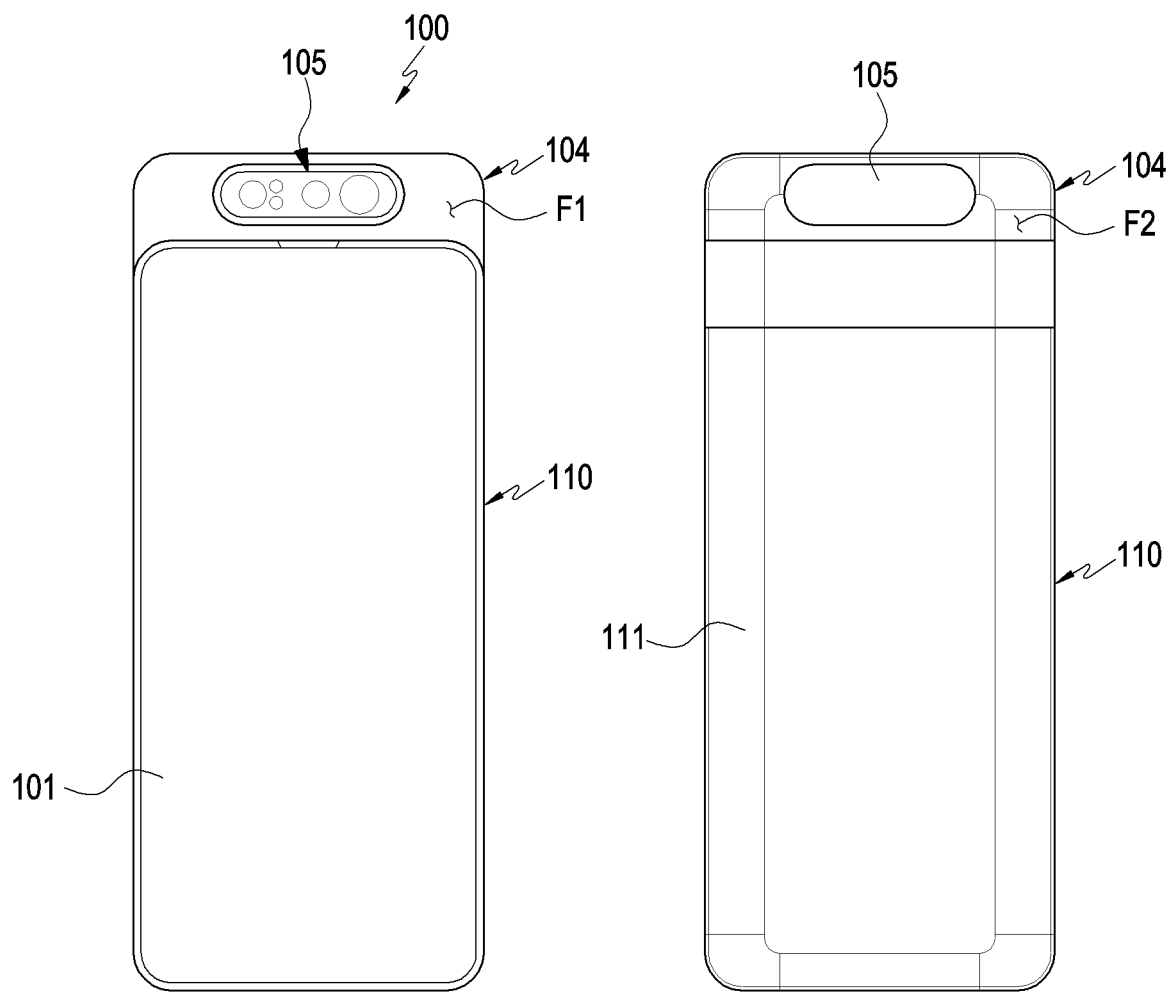
FIG. 5 is a front view illustrating the example electronic device in the state in which the second housing protrudes from the first housing according to various embodiments.
FIG. 6 is a rear view illustrating the example electronic device in the state in which the second housing protrudes from the first housing according to various embodiments.

FIG. 5 is a front view illustrating the example electronic device 100 according to various embodiments in the state in which the second housing 104 protrudes from the first housing 110. FIG. 6 is a rear view illustrating the example electronic device 100 according to various embodiments in the state in which the second housing 104 protrudes from the first housing 110.

Referring to FIGS. 5 and 6, when the second housing 104 slides and reaches the second position (e.g., the second position P2 in FIG. 7), at least a portion of the second housing 104 or the optical module 105 may protrude to one side of the first housing 110. For example, at the second position P2, the front face F1 of the second housing 104 may be at least partially exposed on one side of the display 101 to the front side of the electronic device 100. According to an embodiment, while the second housing 104 is sliding to the second position, the optical module 105 may rotate so as to be exposed to the front side of the first housing 110. For example, the cameras 112 and 113, the infrared projector 116, the light-emitting element, or the illumination sensor mounted on the optical module 105 may be disposed on one side of the display 101 at the second position P2 so as to be oriented in a direction substantially the same as the direction in which the display 101 outputs a screen.

In the following detailed description, for components, which are the same as those of the preceding embodiments or can be easily understood through the preceding embodiments, the same reference numerals may be assigned or reference numerals may be omitted, and detailed descriptions thereof may also be omitted.

Figure 7:
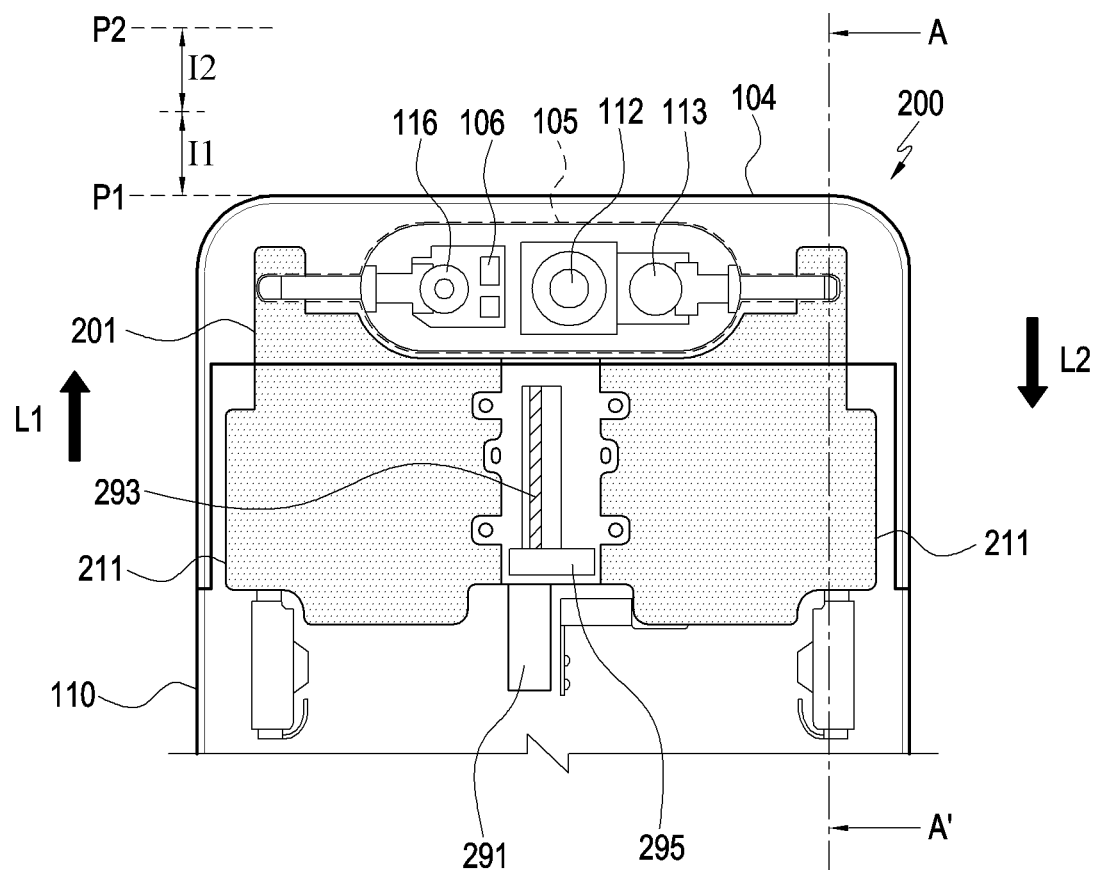
FIG. 7 is a diagram illustrating the example electronic device in which a portion of the electronic device is cut away according to various embodiments.
Figure 8:
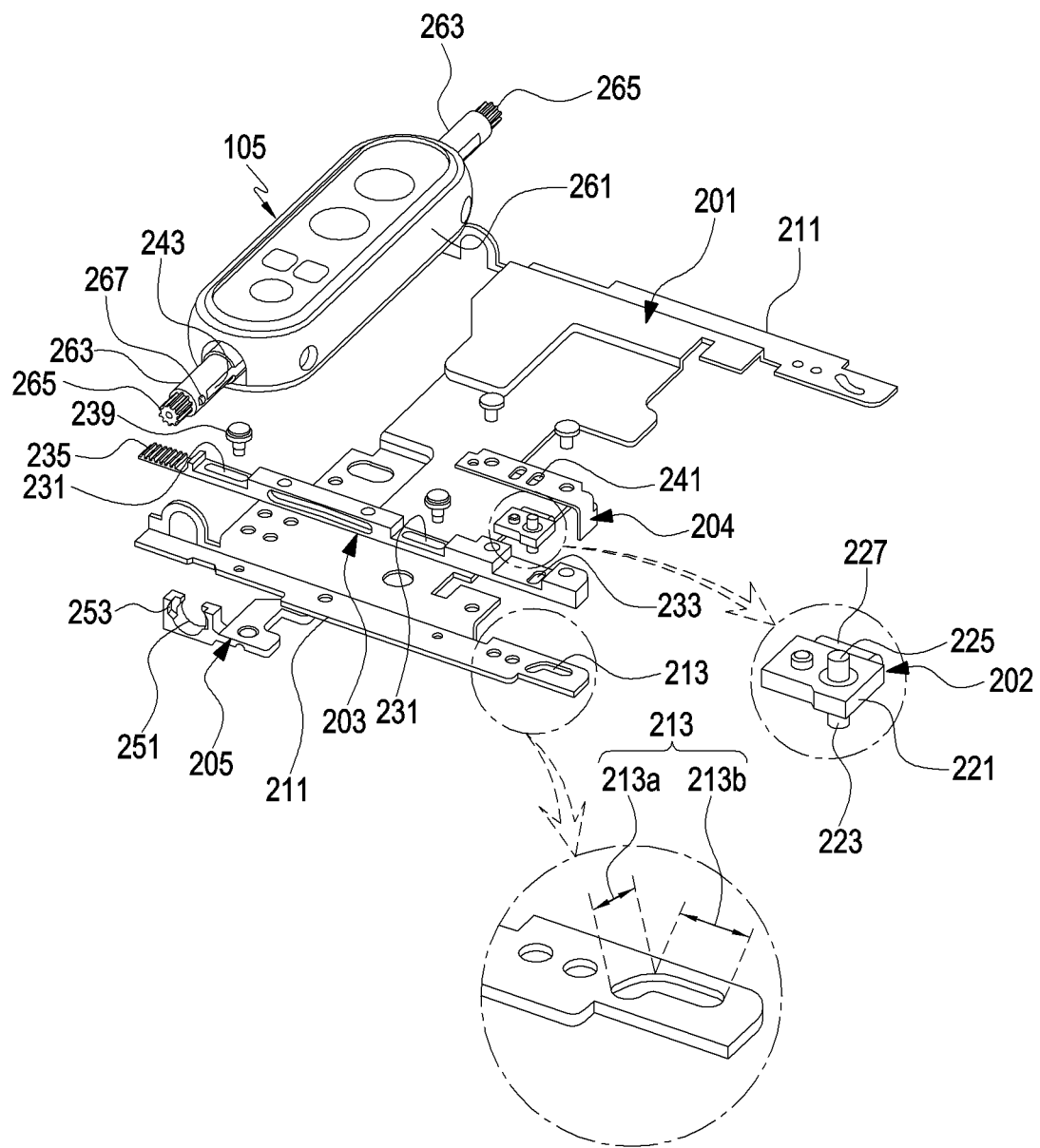
FIG. 8 is an exploded perspective view illustrating an example rotating configuration of an optical module in the electronic device according to various embodiments.

FIG. 7 is a diagram illustrating an example electronic device 200 (e.g., the electronic device 100 in FIG. 1 or 2) according to various embodiments in which a portion of the electronic device is cut away. FIG. 8 is an exploded perspective view illustrating an example rotating configuration of an optical module 105 in the electronic device 200 according to various embodiments.

Referring to FIGS. 7 and 8, the electronic device 200 (e.g., the electronic device 100 in FIG. 1 or 6) may include a first slide member 201 mounted on a second housing 104, and the first slide member 201 may be slidably coupled to the first housing 110. According to an embodiment, the first slide member 201 may include guide ribs 211 formed at both of side sides thereof, and the guide ribs 211 may be coupled to the first housing 110 to be slidable in a first direction L1 or in a second direction L2.

According to various embodiments, the electronic device 200 may further include a driving motor 291, a lead screw 293, or a driven member 295. The lead screw 293 may be disposed parallel to the first direction L1 or the second direction L2, and the driven member 295 may be mounted on the first slide member 201 in the state of being screwed with the lead screw 293. For example, when the lead screw 293 rotates, the driven member 295 may linearly move in the first direction L1 or the second direction L2. In an embodiment, the driving motor 291 may be disposed inside the first housing 110, and may rotate the lead screw 293. For example, when the driving motor 291 operates, the first slide member 201 or the second housing 104 may linearly move in the first direction L1 or the second direction L2.

According to various embodiments, the optical module 105 may include a case 261 that accommodates one or more electronic components and rotating shafts 263 extending from the case 261. According to an embodiment, the electronic components may include the cameras 112 and 113, the infrared projector 116, the light-emitting element 106, or the illuminance sensor in FIG. 2, and the light may be input or output to the outside through one face of the case 261. According to an embodiment, the rotating shafts 263 may extend from both ends of the case 261, and may be rotatably mounted inside the second housing 104. In some embodiments, when mounted to the second housing 104, the rotating shafts 263 may be aligned in a direction perpendicular to the first direction L1 or the second direction L2.

According to various embodiments, the electronic device 200 (e.g., the electronic device 100 in FIG. 1) may further include a rotation support member 205. The rotation support member 205 is for rotatably coupling, for example, the optical module 105 to the first slide member 201, and may be mounted on the first slide member 201. Although only one rotatable support member 205 is illustrated in FIG. 8, this is for the sake of brevity of the drawing and in various embodiments, a pair of the rotation support members 205 may be arranged to be symmetrical to each other. According to an embodiment, the rotation support member 205 may include a rotation hole 251 to rotatably receive one of the rotating shafts 263.

According to various embodiments, the electronic device 200 may include a rotation stopper 267 protruding from an outer circumferential face of the rotating shaft 263 and a rotation guide groove 253 formed in the outer circumferential face of the rotation support member 205 around the rotation hole 251. According to an embodiment, when the optical module 105 is coupled with the rotation support member 205, the rotation stopper 267 may be accommodated in the rotation guide groove 253. For example, the rotation stopper 267 may rotate within the rotation guide groove 253, and depending on an angle range in which the rotation guide groove 253 is formed, the movement range of the rotation stopper 267 or the rotating range of the optical module 105 may be limited. The optical module 105 is rotatable between a position at which the optical module 105 faces the rear side of the first housing 110 and a position at which the optical module 105 faces the front side of the first housing 110. Thus, the optical module 105 is rotatable in a substantially 180 degree angle range.

According to various embodiments, the electronic device 200 may further include a guide stopper 202 or a second slide member 203. Although FIG. 8 illustrates the configuration in which one guide stopper 202 or one second slide member 203 is disposed is illustrated, a pair of stoppers 202 or a pair of second slides 203 may be arranged to be symmetrical to each other. According to an embodiment, the guide stopper 202 may slide in a section (e.g., a first section I1 in FIG. 7) in a first direction L1 or a second direction L2 together with the second housing 104 or the first slide member 201. In another section (e.g., a second section I2 in FIG. 7), the guide stopper 202 may be fixed on the first housing 110 and the second housing 104 or the first slide member 201 may slide with respect to the first housing 110 or the guide stopper 202. In the movement in the first direction L1 or the second direction L2, the second slide member 203 may be constrained to the guide stopper 202. For example, the second slide member 203 may slide in the first section I1 with respect to the first housing 110 together with the guide stopper 202, and when the second housing 104 or the first slide member 201 slides in the second section I2, the guide stopper 202 may be fixed on the first housing 110.

According to various embodiments, the guide stopper 202 may include a first guide protrusion 223 protruding from one face of the body 221 thereof and a second guide protrusion 225 protruding in a direction opposite the first guide protrusion 223 on the other face of the body 221 or a stopper protrusion 227 formed on the side face. In an embodiment, the first slide member 201 may include a first guide hole 213 corresponding to the first guide protrusion 223. The first guide hole 213 may include an inclined section 213a extending inclined with respect to the first direction L1 or the second direction L2 and a linear section 213b extending in the first direction L1 or the second direction L2 from one end of the inclined section 213a.

According to various embodiments, the first guide protrusion 223 may be located in the inclined section 213a while the second housing 104 or the first slide member 201 moves in the first section I1 from the first position P1 toward the second position P2. For example, the guide stopper 202 may move in the first section I1 together with the second housing 104 (or the first slide member 201). When the second housing 104 reaches the second section I2, an unillustrated structure may move the first guide protrusion 223 to the linear section 213b while interfering with the guide stopper 202. When the first guide protrusion 223 is located in the linear section 213b, the guide stopper 202 may be fixed on the first housing by the stopper protrusion 227 even if the second housing 104 moves in the second section I2.

According to various embodiments, in the operation of moving from the second position P2 to the first position P1, the first guide protrusion 223 may move in the linear section 213b to gradually approach the inclined section 213a. According to an embodiment, when the second housing 104 (or the first slide member 201) enters the first section I1 from the second section I2 and when the first guide protrusion 223 is located in the inclined section 213a, the guide stopper 202 may slide in the first section I1 with respect to the first housing 110 together with the second housing 104 (or the first slide member 201). In an embodiment, assuming that the second housing 104 slides with respect to the first housing 110 in the range of 10 mm, the first section I1 is about 4 to 5 mm from the first position P1, and the second section I2 may be about 5 to 6 mm from the second position P2. The relative length of the first section I1 and the second section I2 may be variously set in consideration of the rotating angle of the optical module 105 with respect to the size or shape of an actually manufactured electronic device or the moving distance of the second housing 104.

According to various embodiments, the second slide member 203 may be movably mounted on the first slide member 201 in the form of a rail extending in the direction in which the second housing 104 (or the first slide member 201) moves (e.g., the first direction L1 or the second direction L2 in FIG. 7). In an embodiment, the guide stopper 202 may be seated on the second slide member 203. In some embodiments, the second slide member 203 may include a second guide hole 233 extending in a direction perpendicular to the first direction L1. The first guide protrusion 223 may be accommodated in the first guide hole 213 after passing through the second guide hole 233. For example, the second slide member 203 may slide with respect to another structure (e.g., the first slide member 201) together with the guide stopper 202 in the first direction L1 or the second direction L2.

According to various embodiments, the electronic device 200 may further include a fixing member 204 configured to restrain the guide stopper 202 to the second slide member 203. For example, the fixing member 204 may be mounted on the second slide member 203, and the guide stopper 202 may be disposed between the second slide member 203 and the fixing member 204. According to various embodiments, the fixing member 204 may have a third guide hole 241 formed to correspond to the second guide protrusion 225. The third guide hole 241 may extend in a direction perpendicular to the first direction L1. For example, in the direction perpendicular to the first direction L1, the guide stopper 202 may linearly reciprocate with respect to the second slide member 203 or the fixing member 204. In some embodiments, there may be provided a plurality of second guide protrusions 255 or a plurality of third guide holes 241.

According to various embodiments, the electronic device 200 may further include a fourth guide hole 231 and a guide screw 239. In an embodiment, the fourth guide hole 231 may be formed to extend in the first direction L1 and to pass through the second slide member 203. The guide screw 239 may be fastened to the first slide member 201 by passing through the second slide member 203 through the fourth guide hole 231. For example, the guide screw 239 may be couple the second slide member 203 to the first slide member 201 in the state capable of linear reciprocating motion. As described above, in the first direction L1, the second slide member 203 may be restrained by the guide stopper 202 in the first direction L1 and may slide in the first section I1 with respect to the first housing 110 together with the first slide member 201, and in the second section I2, the second slide member 203 may maintain the state of being fixed on the first housing 110 even if the first slide member 201 is moved in the second section I2.

According to various embodiments, the electronic device 200 may further include a rack gear 235 and a pinion gear 265. In an embodiment, the rack gear 235 is formed on the second slide member 203, the pinion gear 265 is provided at the end of the rotating shaft 263 to be engaged with the rack gear 235. For example, when the first slide member 201 slides in the second section I2, the pinion gears 265 may be rotated by being engaged with the rack gear 235 while linearly moving with respect to the rack gear 235. Thus, when the first slide member 201 slides at least in the second section I2, the optical module 105 may rotate. For example, depending on the sliding of the second housing 104, the optical module 105 may be disposed to face the rear side of the electronic device 200 at the first position P1, and may be disposed to face the front side of the electronic device 200 at the second position P2.

According to various embodiments, the electronic device 200 may further include an elastic member that provides an elastic force to any one of the rotating directions of the optical module 105. In an embodiment, the elastic member may provide an elastic force in the rotating direction of the optical module 105 in an operation in which the second housing 104 or the optical module 105 moves from the first position P1 to the second position P2. In another embodiment, the elastic member may provide an elastic force in the rotating direction of the optical module 105 in an operation in which the second housing 104 or the optical module 105 moves from the second position P2 to the first position P1. In some embodiments, the elastic member may include a flexible printed circuit board, or may be formed of a flexible printed circuit board. For example, a flexible printed circuit board connecting components within the optical module 105 (e.g., the cameras 112 and 113, the infrared projector 116, or the flash 106 provided as a light-emitting element) to other components of the electronic device 200 (e.g., a printed circuit board or a processor) may be used as an elastic member that provides a rotational force to the optical module 105. The configuration of the elastic member or the flexible printed circuit board described above will be described in greater detail below with reference to FIGS. 9, 10 and 11.

Figure 9:
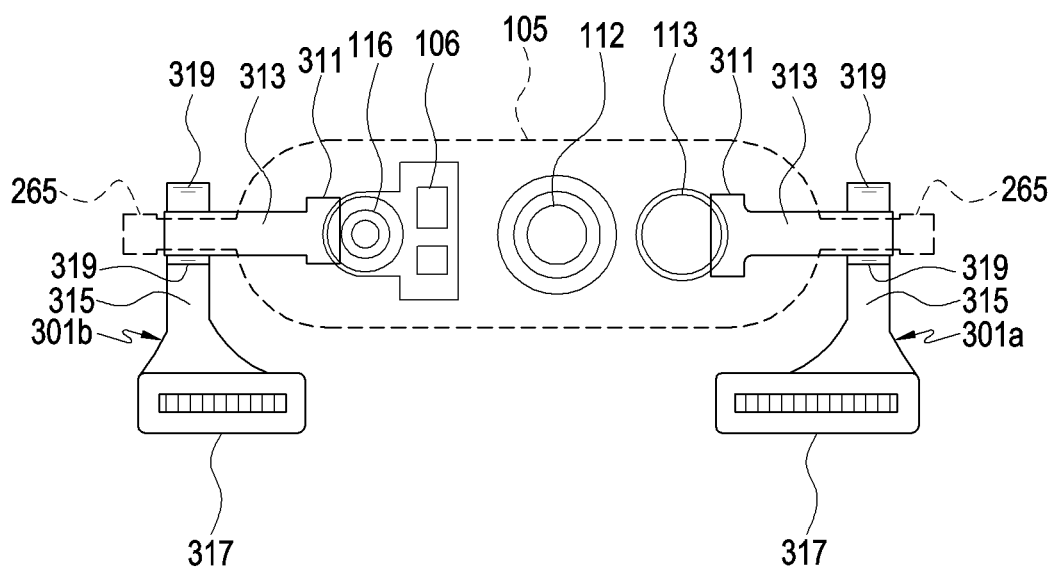
FIG. 9 is a diagram illustrating an example structure in which elastic members are arranged in the optical module of the electronic device according to various embodiments.
Figure 10:
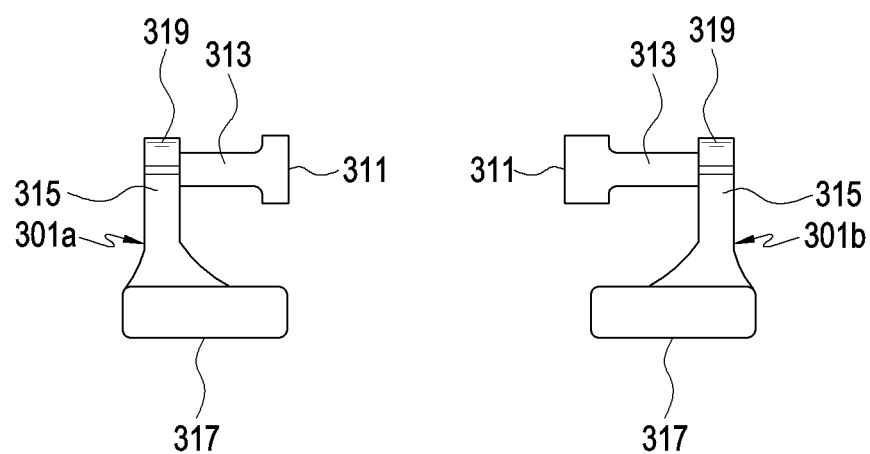
FIG. 10 is a bottom view illustrating example elastic members of the electronic device according to various embodiments.

FIG. 9 is a diagram illustrating an example structure in which elastic members (e.g., flexible printed circuit boards 301a and 301b) are arranged in the optical module 105 of an electronic device (e.g., the electronic device 100 or 200 in FIG. 1 or FIG. 7) according to various embodiments. FIG. 10 is a is a diagram illustrating the example elastic members (e.g., the flexible printed circuit boards 301a and 301b) of the electronic device according to various embodiments.

Referring to FIGS. 9 and 10, the elastic members (e.g., the flexible printed circuit boards 301a and 301b) may be provided at respective opposite sides of the optical module 105. The number of flexible printed circuit boards 301a and 301b may differ from that in the example illustrated in FIG. 9 or 10 depending on the number or types of electronic components disposed in the optical module 105. When a plurality of flexible printed circuit boards 301a and 301b are provided, the number and shapes of patterns or connector pins of the printed circuits may be different from each other, but the appearances thereof may be similar to each other. For example, the flexible printed circuit boards 301a and 301b may be variously implemented depending on the number or types of connected electronic components.

According to various embodiments, each of the flexible printed circuit boards 301a and 301b may include a first connector 311, a first extension 313, a second extension 315, or a second connector 317. The first connector 311 may be electrically connected to an electronic component (e.g., the camera 113 or the infrared projector 116) within the optical module 105 (e.g., the case 261 in FIG. 8). The first extension 313 is extended from the first connector 311, and may be disposed inside the rotating shaft 263. In an embodiment, the rotating shaft 263 may include a slit (e.g., a slit 243 or 463 in FIG. 8 or 17) in which the first extension part 313 is disposed. The second extension 315 extends from one side of the first extension 313, and may be aligned substantially parallel to the first direction L1 or the second direction L2. The second connectors 317 are provided at the ends of the second extensions 315, respectively, and the flexible printed circuit boards 301a and 301b may be electrically connected to different circuit boards via the second connectors 317, respectively.

According to various embodiments, the second extensions 315 may be disposed to at least partially surround the peripheries of the rotating shafts 263, respectively. In an embodiment, each second extension 315 may form at least one curved portion 319 around the corresponding one of the rotating shafts 263 depending on the angular position of the optical module 105 or the rotating shafts 263. Each of the substrates of the flexible printed circuit boards 301a and 301b may be made of a polymer synthetic resin film such as polyimide, and may accumulate an elastic force in the curved shape. In some embodiments, the flexible printed circuit boards 301a and 301b may be arranged to apply the accumulated elastic force in the rotating direction of the optical module 105.

Figure 11:
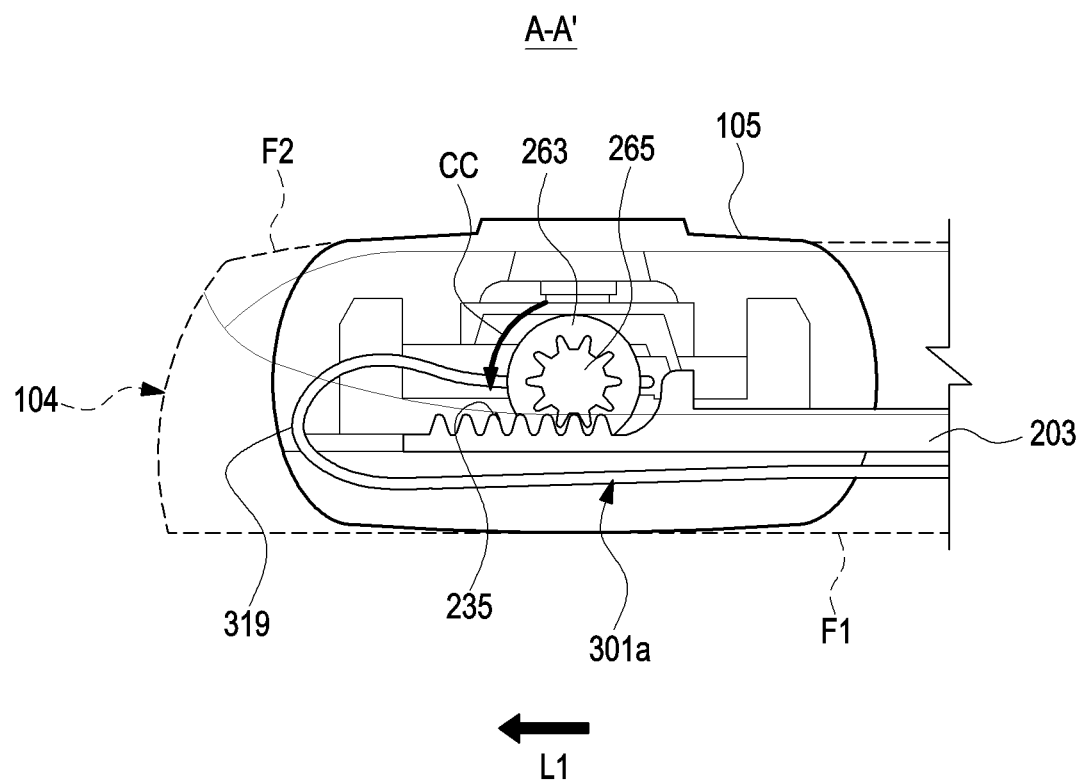
FIG. 11 is a side view illustrating an example electronic device in which a portion of the electronic device is cut away according to various embodiments.

FIG. 11 is a side view illustrating an example electronic device 200 (e.g., the electronic device 100 or 200 in FIG. 1 or 7) according to various embodiments in which a portion of the electronic device is cut away.

FIG. 11 illustrates a view obtained by cutting a portion of the electronic device 200 along, for example, line A-A' in FIG. 7, in which the arrangement state of the elastic member, e.g., the flexible printed circuit board 301a may be illustrated at the first position P1, for example, at the position at which the second housing 104 is accommodated in the first housing 110. In another embodiment, FIG. 11 may illustrate the arrangement state of the flexible printed circuit board 301a before entering the second section I2. Referring to FIG. 11, at the first position P1 (or the position before entering the second section I2), the flexible printed circuit board 301a may form one curved portion 319 and may be arranged generally in the letter "U" shape.

According to various embodiments, when the second housing 104 moves in the first direction L1, for example, leftwards in FIG. 11, in the second section I2, the pinion gear 265 may also rotate in the counterclockwise direction CC by the rack gear 235 while moving in the first direction L1. As the pinion gear 265 rotates in the counterclockwise direction CC, a portion of the flexible printed circuit board 301a may gradually enter the lower portion of the rotating shaft 263 (e.g., the space between the front face F1 of the second housing 104 and the rotating shaft 263 or the space between another portion of the flexible printed circuit board 301a and the rotating shaft 263). As a portion of the flexible printed circuit board 301a moves downwards of the rotating shaft 263, an additional curved portion may be formed on the right side of the rotating shaft 263 in FIG. 11. For example, as the second housing 104 approaches the second position P2, the flexible printed circuit board 301a may be arranged to form a plurality of curved portions. According to an embodiment, in the state in which the lengths of the inner space of the second housing 104 and the flexible printed circuit board 301a remain substantially the same, the elastic force accumulated in the flexible printed circuit board 301a may increase since additional curved portions are formed.

Hereinafter, an operation in which the second housing 104 moves from the second position P2 to the first position P1 will be described in greater detail below with reference to FIGS. 12, 13, 14, 15, 16, 17 and 18.

FIGS. 12, 13, 14, 15 and 16 are diagrams illustrating an example operation in which the second housing 104 is accommodated in the first housing 110 in an electronic device (e.g., the electronic device 100 or 200 in FIG. 1 or 7) according to various embodiments.

Figure 12:
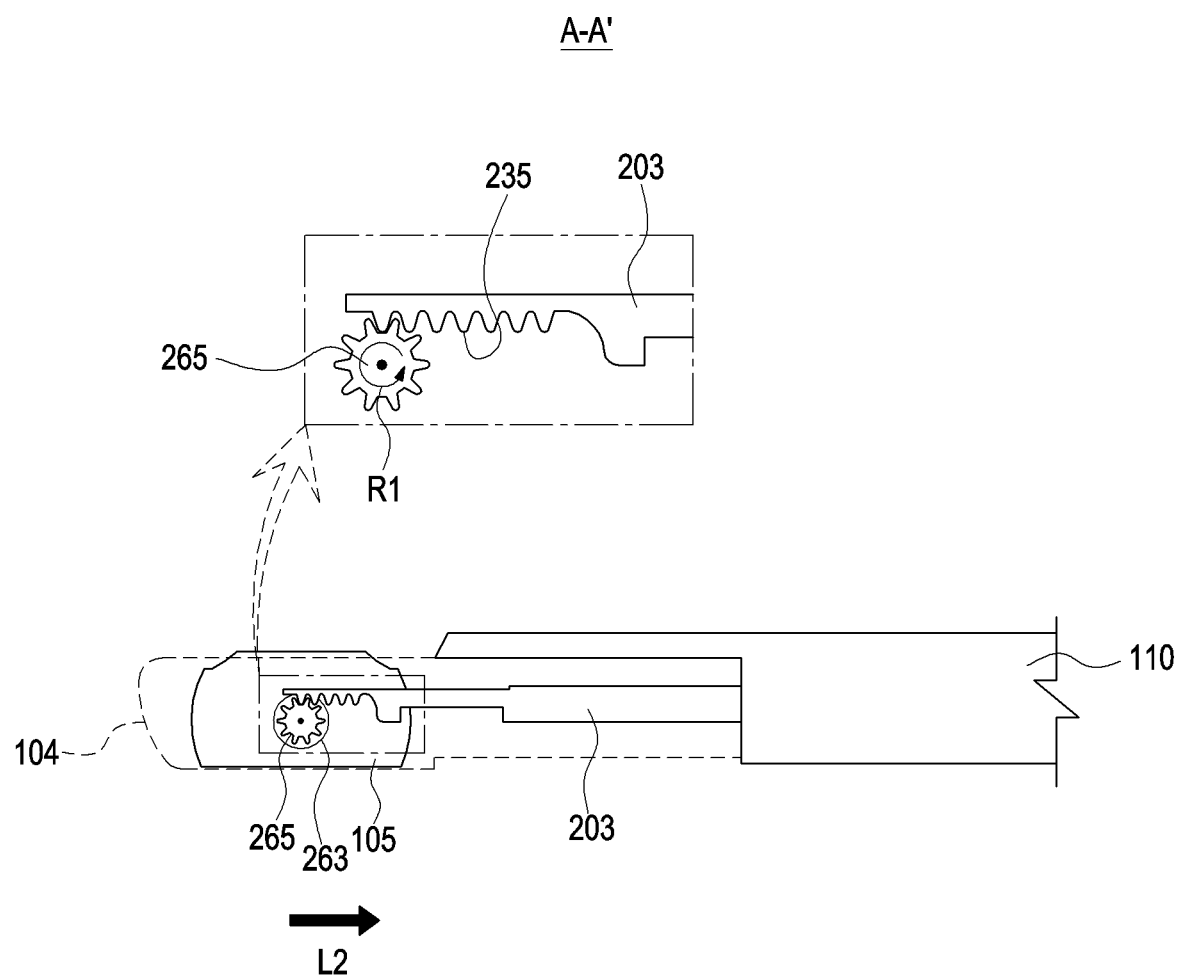
FIGS. 12, 13, 14, 15 and 16 are diagrams illustrating an example operation in which a second housing is accommodated in a first housing in the electronic device according to various embodiments.
Figure 13:
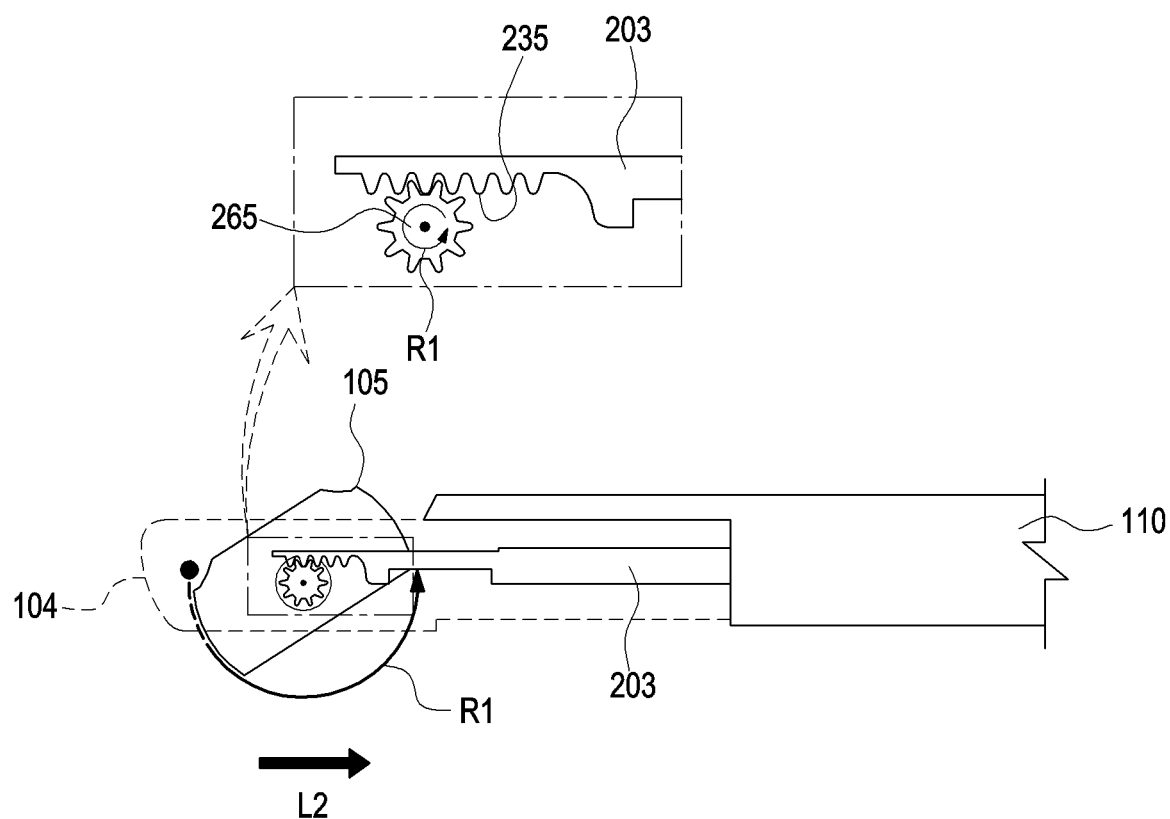
Figure 14:
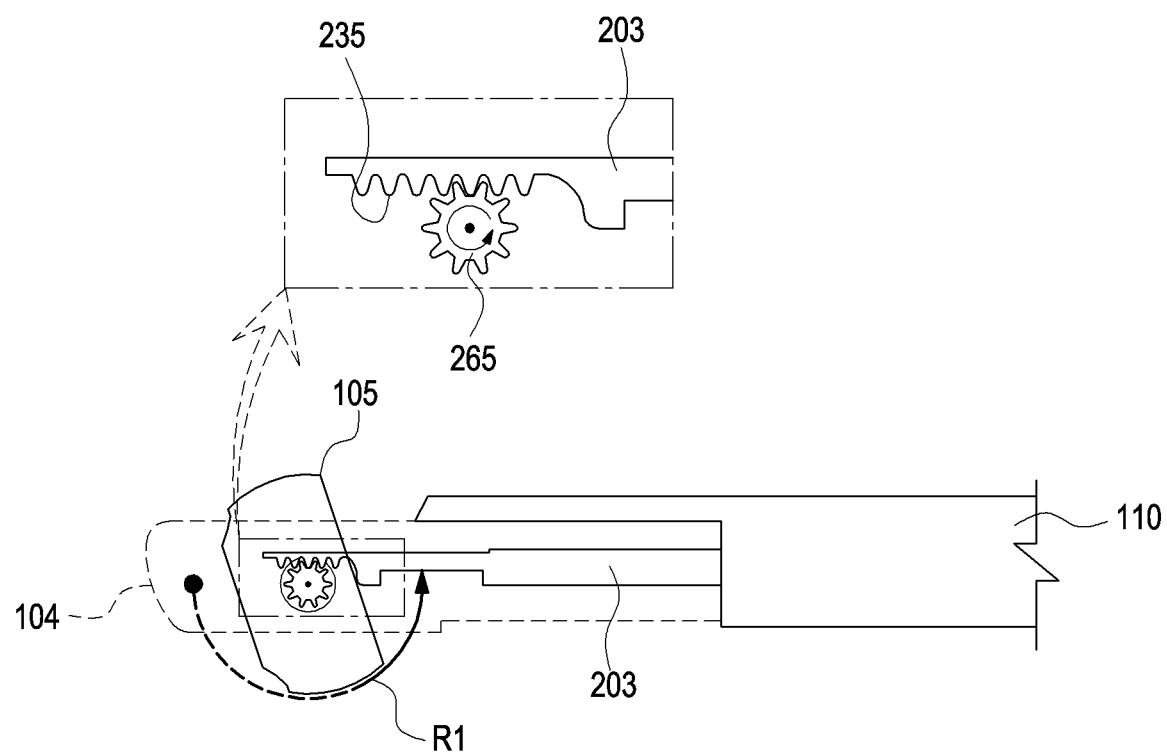
Figure 15:
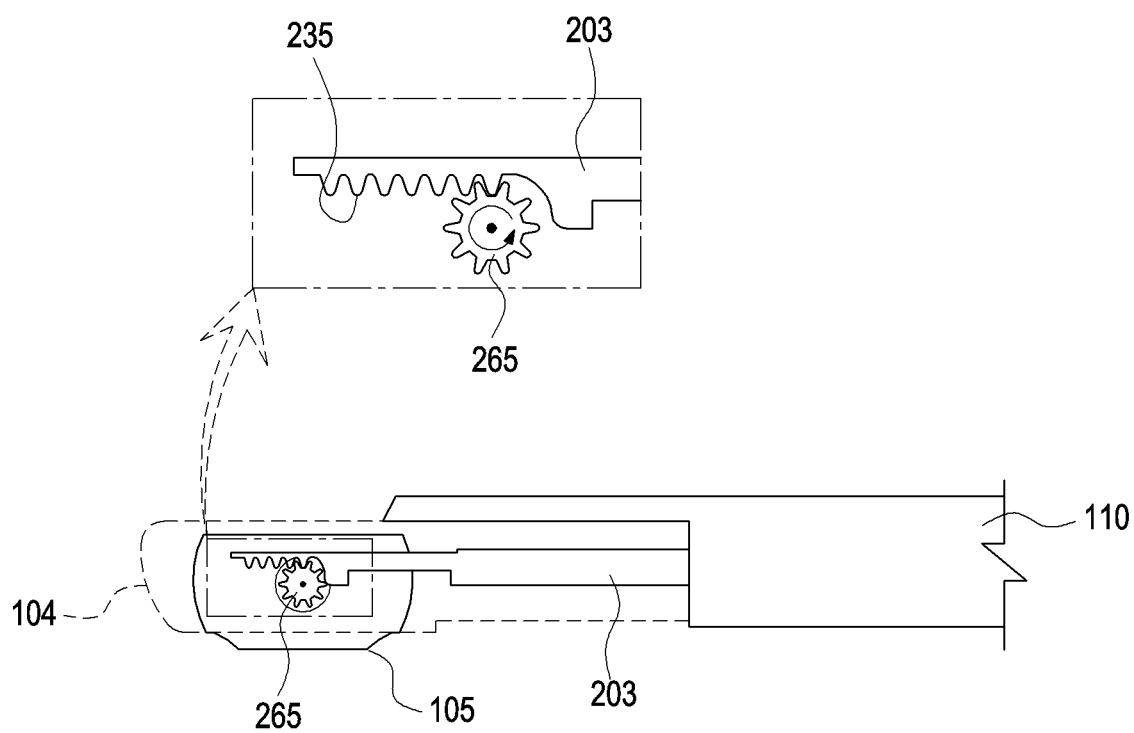

FIG. 12 illustrates the relative position of the optical module 105, the rack gear 235, or the pinion gear 265 at the second position P2. When a driving motor (e.g., the driving motor 291 in FIG. 7) is operated and thus the second housing 104 slides from the second position P2 to the first position P1 (e.g., in the second direction L2), the optical module 105 may be rotated to face the rear side of the electronic device 100 while the second housing 104 moves in the second section I2. For example, during the movement in the second section I2, the second slide member (e.g., the second slide member 203 in FIG. 8) or the guide stopper (e.g., the guide stopper 202 in FIG. 8) remains fixed on the housing 110. Thus, the pinion gear 265 may rotate the optical module 105 while rotating. FIGS. 13 to 15 sequentially illustrate an operation in which the second housing 104 moves in the second direction L2 in the second section I2. While the second housing 104 moves in the second direction L2 in the second section I2, the optical module 105 may rotate by an angle of 180 degrees in the first rotating direction R1.

According to various embodiments, while the second housing 104 moves in the second section I2, the first guide protrusion (e.g., the first guide protrusion 223 in FIG. 8) may be located in the linear section 213b of the first guide hole (e.g., the first guide hole in FIG. 8). For example, even if the second housing 104 (or the first slide member 201 in FIG. 8) slides with respect to the first housing 110 in the second section I2, the first guide protrusion 223 or the guide stopper 202 may remain fixed on the first housing 110.

Figure 16:
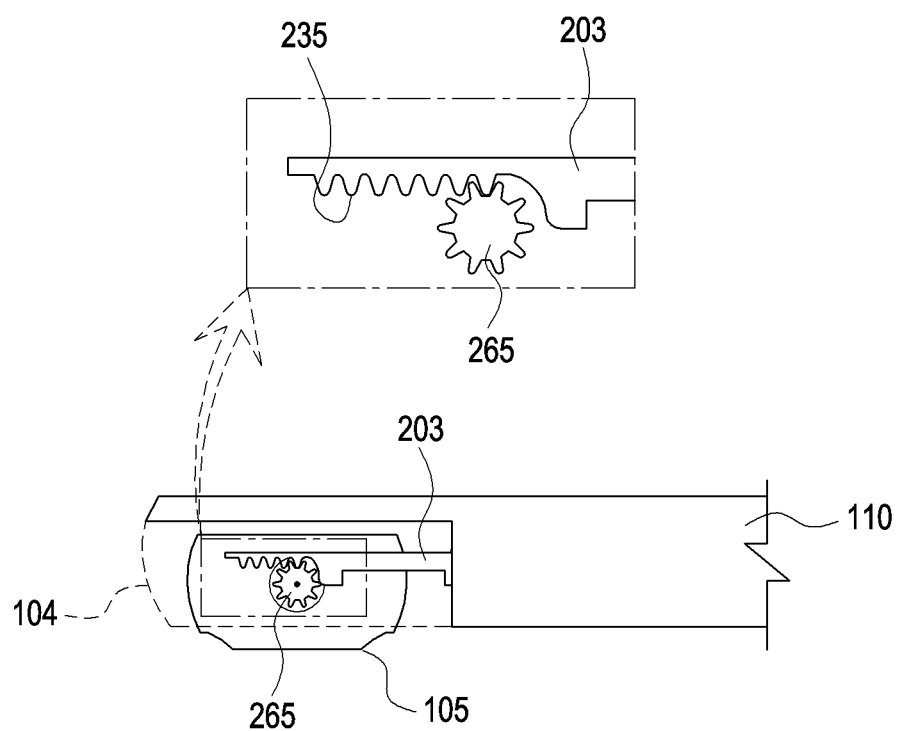

According to various embodiments, at the position illustrated in FIG. 15, the second housing 104 may reach the first section I1. In an embodiment, when the second housing 104 reaches the first section I1, the first guide protrusion 223 may be restrained by the first slide member 201 in the second direction L2 while entering the inclined section of the first guide hole 213 (e.g., the inclined section in FIG. 8). For example, in the first section I1, the first guide protrusion 223 or the guide stopper 202 may move to the first position P1 together with the first slide member 201 or the second slide member 203. Since the second slide member 203 is restrained by the guide stopper 202 in the second direction L2, in the first section I1, the second slide member 203 may also move toward the first position P1 together with the first slide member 201 or the optical module 105. In the first section I1, since the optical module 105 (e.g., the pinion gear 265) and the second slide member 203 (e.g., the rack gear 235) move linearly together, the optical module 105 may move to the first position P1 together with the second housing 104 without rotating. The state in which the second housing 104 has reached the first position P1 is illustrated in FIG. 16.

According to various embodiments, the operation of moving from the first position P1 to the second position P2 may be performed in the reverse order of the operation sequentially disclosed in FIGS. 12, 13, 14, 15 and 16. For example, at the first position P1, the first guide protrusion 223 may be located in the inclined section 213a. At the first position P1, the optical module 105 may be disposed to face the rear side of the electronic device 100, as illustrated in FIG. 4. When the first slide member 201 slides according to the operation of the driving motor 291, the first guide protrusion 223 may also move the second slide member 203 while moving together with the first slide member 201. For example, in the first section I1, the second slide member 203 may also move in the first position L1 together with the first slide member 201. As a result, since the rack gear 235 and the pinion gear 265 move together in the first direction L1 in the first section I1, the optical module 105 may move in the first direction L1 together with the second housing 104 without rotating.

According to various embodiments, when the second housing 104 enters the second section I2, the first guide protrusion 223 may move to the linear section 213b while the guide stopper 202 moves in an inclined direction with respect to the first slide member 201. When the first guide protrusion 223 is located in the linear section 213b, the guide stopper 202 may be fixed on the first housing 110 by the stopper protrusion 227. For example, even if the second housing 104 slides in the second section I2, the guide stopper 203 or the second slide member 203 may remain fixed on the first housing 110. Since the second slide member 203 or the rack gear 235 remains fixed on the first housing 110 in the second section I2, when the second housing 104 slides, the pinion gear 265 may rotate the optical module 105 while rotating. When the second housing 104 reaches the second position P2, the optical module 105 may be disposed to face the front side of the electronic device 100, as illustrated in FIG. 6.

The configuration, in which an elastic member (e.g., the flexible printed circuit board 301a in FIG. 9 or 10) provides an elastic force in the slide operation of the second housing 104 as described above, will be described with reference to FIGS. 17 and 18.

Figure 17:
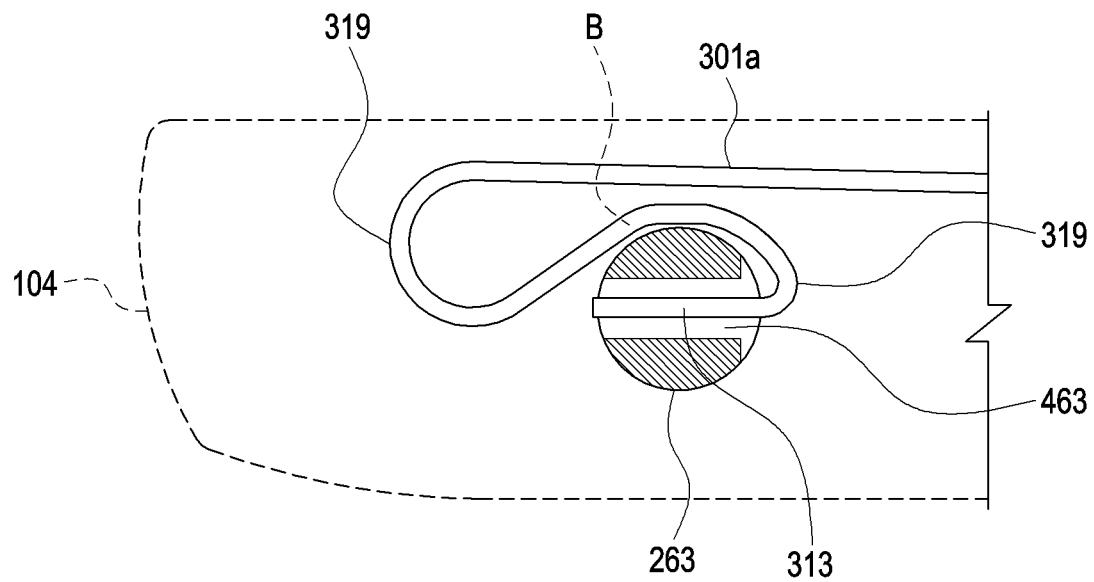
FIG. 17 is a diagram illustrating an example position or arrangement of an elastic member in the state in which a second housing protrudes from the first housing in an electronic device according to various embodiments.
Figure 18:
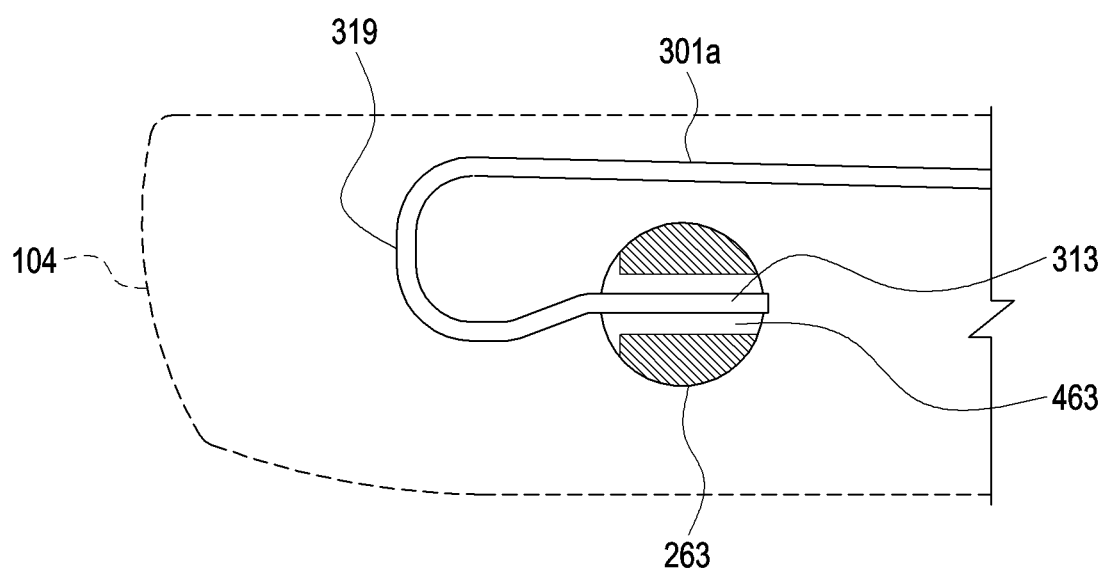
FIG. 18 is a diagram illustrating an example position or arrangement of an elastic member in the state in which the second housing is accommodated in the first housing in the electronic device according to various embodiments.

FIG. 17 is a diagram illustrating an example position or arrangement of an elastic member (e.g., a flexible elastic material such as, for example, and without limitation, the flexible printed circuit board 301a) in the state in which the second housing 104 protrudes from the first housing (e.g., the first housing 110 in FIG. 7) (e.g., the state illustrated in FIG. 5 or FIG. 6) in an electronic device (e.g., the electronic device 100 or 200 in FIG. 1 or 7) according to various embodiments. FIG. 18 is diagram illustrating an example position or arrangement of an elastic member (e.g., the flexible printed circuit board 301a) in the state in which the second housing 104 is accommodated in the first housing (e.g., the first housing 110 in FIG. 1 or 7) in the electronic device (e.g., the electronic device 100 or 200 in FIG. 1 or 7) according to various embodiments.

Referring to FIG. 12 along with FIG. 17, at the second position P2, for example, in the state in which the second housing 104 protrudes from the first housing 110, a portion of the flexible printed circuit board 301a (e.g., the second extension 315 in FIG. 9 or 10) (hereinafter, referred to as a "movable portion B") may be interposed between the rotating shaft 263 and the other portion of the flexible printed circuit board 301a. In an embodiment, the movable portion B may be a portion of the second extension 315 described above. The first extension 313 of the flexible printed circuit board 301a may be substantially fixed in the slit 463 (e.g., the slit 243 in FIG. 8) formed in the rotating shaft 263, and may form a curved portion 319 while one end of the movable part B is connected to the first extension 313. In another embodiment, since the movable portion B is interposed between the rotating shaft 263 and the other portion of the flexible printed circuit board 301a, the flexible printed circuit board 301a may be disposed such that at least a portion thereof forms a letter "S" shape. For example, the flexible printed circuit board 301a may form a plurality of curved portions 319 in the opposite end portions of the movable portion B.

According to various embodiments, the flexible printed circuit board 301a may accumulate an elastic force of a tendency to be restored to a flat plate shape, and the elastic force may act in a direction in which the radius of curvature of each curved portion 319 increases. For example, in the state illustrated in FIG. 17, the movable portion B may have a tendency to break away from the space between the rotating shaft 263 and the other portion of the flexible printed circuit board 301a to the left side. For example, in FIG. 17, the movable portion B or the flexible printed circuit board 301a may provide an elastic force for rotating the rotating shaft 263 in a counterclockwise direction (e.g., the first rotating direction R1 in FIG. 12).

Referring to FIG. 18, when the second housing 104 moves in the first section I1 or reaches the first position P1, the flexible printed circuit board 301a may form one curved portion 319. For example, when the second housing 104 moves in the first section I1 or reaches the first position P1, at least a portion of the flexible printed circuit board 301a may form a letter "U" shape. In an embodiment, the curved portion 319 may accumulate an elastic force for returning the flexible printed circuit board 301a to a flat plate shape. The elastic force accumulated in the flexible printed circuit board 301a in the state of being arranged in the letter "U" shape may not substantially apply a rotation force for rotating the rotating shaft 263.

According to various embodiments, a backlash may occur between gears (e.g., the rack gear 235 and the pinion gear 265 in FIGS. 12 to 16), and the backlash may reduce the accuracy of power transmission or the accuracy of relative moving rate between the structures connected via the gears. For example, the backlash may distort the relative moving rate depending on the operating direction or section of the structures interlocked with each other by the gears. According to an embodiment disclosed herein, the elastic force provided by the flexible printed circuit board 301a may keep the rotating angle of the optical module 104 according to the linear moving distance of the second housing 104 constant by bringing the teeth of the gears into close contact with each other. For example, even if there is a backlash between the rack gear and the pinion gear (e.g., the rack gear 235 and the pinion gear 265 in FIG. 8), the flexible printed circuit board 301a may provide an elastic force, thereby improving the relative moving rate due to the backlash.

Figure 19:
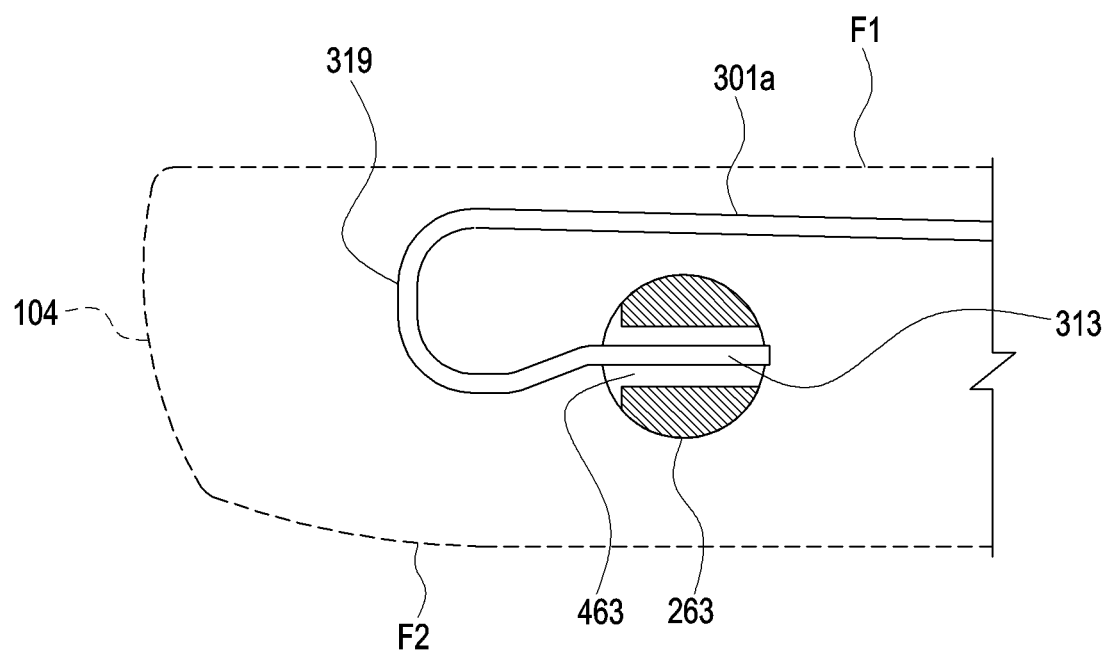
FIG. 19 is a diagram illustrating an example position or arrangement of an elastic member in the state in which the second housing protrudes from the first housing of an electronic device according to various embodiments.
Figure 20:
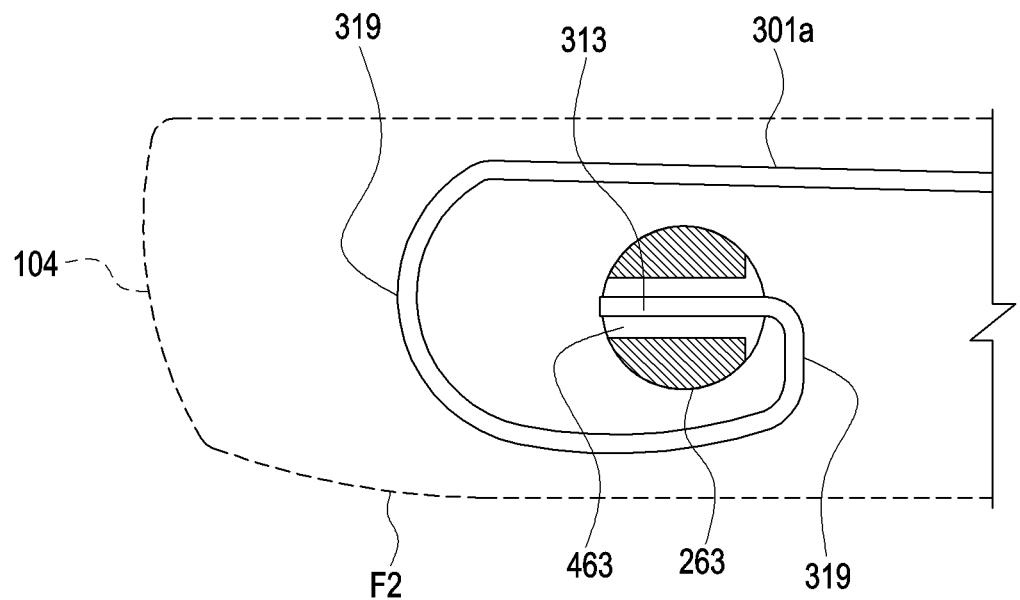
FIG. 20 is a diagram illustrating an example position or arrangement of an elastic member in the state in which the second housing is accommodated in the first housing in an electronic device according to various embodiments.

FIG. 19 is a diagram illustrating an example position or arrangement of an elastic member (e.g., the flexible printed circuit board 301a) in the state in which the second housing 104 protrudes from the first housing (e.g., the first housing 110 in FIG. 1 or 7) in an electronic device (e.g., the electronic device 100 or 200 in FIG. 1 or 7) according to various embodiments. FIG. 20 is a diagram illustrating an example position or arrangement of an elastic member (e.g., the flexible printed circuit board 301a) in the state in which the second housing 104 is accommodated in the first housing (e.g., the first housing 110 in FIG. 1 or 7) in the electronic device (e.g., the electronic device 100 or 200 in FIG. 1 or 7) according to various embodiments.

According to various embodiments disclosed herein, as illustrated in FIG. 19, at the second position P2, for example, in the state in which the second housing 104 protrudes from the first housing 110, at least a portion of the flexible printed circuit board 301a may be arranged in the letter "U" shape. The elastic force accumulated in the flexible printed circuit board 301a in the state of being arranged in the letter "U" shape may not substantially apply a rotation force for rotating the rotating shaft 263.

Referring to FIG. 20, when the flexible printed circuit board 301a is arranged in the letter "U" shape at the second position P2, a portion of the flexible printed circuit board 301a (e.g., the second extension 315 in FIG. 9 or 10) at the first position P1 (or in the state of being located in the first section I1) may be disposed between the front face of the second housing 104 and the rotating shaft 263, and the other portion may be disposed between the rear face of the second housing 104 and the rotating shaft 263. For example, when located at the first position P2 or in the first section I1, the flexible printed circuit board 301a may be arranged in a spiral shape around the rotating shaft 263. In an embodiment, the flexible printed circuit board 301a may accumulate more elastic force when arranged in a spiral shape than when arranged in the letter "U" shape. For example, at the first position P1, the flexible printed circuit board 301 may provide a rotational force (or an elastic force) that acts in a clockwise direction (e.g., in the reverse direction of the first rotational direction R1 in FIG. 12).

According to various embodiments, the elastic force provided by the flexible printed circuit board 301a may act as a driving force that rotates the optical module 105 when the second housing 104 moves to the second position P2 in the second section I2. In some embodiments, when there is a backlash between the rack gear 235 and the pinion gear 265, the elastic force of the flexible printed circuit board 301a may bring the teeth of the gears into close contact with each other. As the gear teeth are brought into close contact with each other between the rack gear 235 and the pinion gear 265, the rotating angle of the optical module 105 may be kept constant with respect to the sliding distance of the second housing 104.

Figure 21:
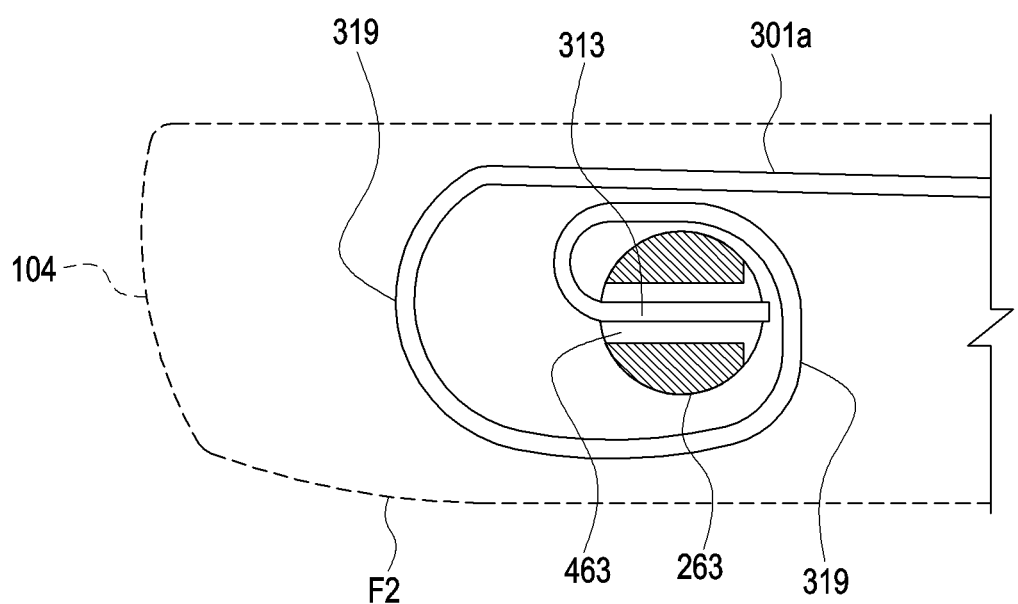
FIG. 21 is a diagram illustrating an example position or arrangement of an elastic member in the state in which the second housing is accommodated in the first housing in an electronic device according to various embodiments.

FIG. 21 is a diagram illustrating an example position or arrangement of an elastic member in the state in which the second housing is accommodated in the first housing in an electronic device according to various embodiments.

As described above, a portion of the flexible printed circuit board 301a (e.g., the second extension 315 in FIG. 9 or 10) at the first position P1 (or in the state of being located in the first section I1) may be disposed between the front face of the second housing 104 and the rotating shaft 263, and the other portion may be disposed between the rear face of the second housing 104 and the rotating shaft 263. In this structure, the embodiment illustrated in FIG. 20 exemplifies a configuration in which the flexible printed circuit board 301a is arranged to surround the rotating shaft 263 in an angle range of approximately 270 degrees at the first position P1. However, it is noted that the disclosure is not limited thereto. For example, referring to FIG. 21, at the first position P1, the flexible printed circuit board 301a may be disposed to surround the rotating shaft 263 in a range exceeding an angle of 360 degrees.

As described above, according to various example embodiments disclosed herein, it is possible to provide an elastic force in the rotating direction of an optical module (e.g., the optical module 105 in FIG. 1, 7, 8, or 12) in at least one of the operation in which the optical module rotates in a first rotating direction (e.g., the first rotating direction R1 in FIG. 13) and the operation in which the operation that rotates in the reverse direction of the first rotating direction R1 in an electronic device (e.g., the electronic device 100 or 200 in FIG. 1 or 7). In the structure in which the optical module is rotated by a combination of a rack gear and a pinion gear (e.g., the rack gear 235 and the pinion gear 265 in FIG. 8 or 12), the elastic force brings the gear teeth into close contact with each other between the rack gear and the pinion gear, whereby it is possible to overcome a backlash and to implement stable linear movement or rotational motion.

According to various example embodiments disclosed herein, an electronic device (e.g., the electronic device 100 or 200 in FIG. 1 or 7) may include: a first housing (e.g., the first housing 110 in FIG. 1 or 7); a second housing (e.g., the second housing 104 in FIG. 1 or 7) coupled to the first housing and configured to slide in a first direction (e.g., the first direction L1 in FIG. 1 or 7) or in a second direction (e.g., the second direction L2 in FIG. 1 or 7) opposite the first direction with respect to the first housing between a first position (e.g., the state illustrated in FIGS. 3 and 4 or the first position P1 in FIG. 7) at which at least a portion of the second housing is accommodated in the first housing and a second position (e.g., the state illustrated in FIGS. 5 and 6 or the second position P2 in FIG. 7) at which the second housing protrudes from the first housing; an optical module comprising optical circuitry (e.g., the optical module 105 in FIG. 1, 7, or 8) mounted on the second housing, the optical module configured to rotate in response to the sliding of the second housing to be disposed to face the rear side of the first housing at the first position and to face the front side of the first housing at the second position; and an elastic member comprising a flexible elastic material (e.g., the flexible printed circuit board 301a or 301b in FIG. 9 or 10) accommodated in the second housing and configured to provide an elastic force to the optical module.

According to various example embodiments, the elastic member may be configured to provide the elastic force in the rotating direction of the optical module (e.g., the first rotating direction R1 or the reverse direction thereof in FIGS. 12 to 14) in a first operation wherein the optical module rotates while moving from the first position to the second position or in a second operation wherein the optical module rotates while moving from the second position to the first position.

According to various example embodiments, the optical module may include at least one of a camera, an infrared projector, a light-emitting device (e.g., the cameras 112 and 113, the infrared projector 116, or the flash 106 in FIG. 7), or an illuminance sensor.

According to various example embodiments, the electronic device may further include a display (e.g., the display 101 in FIG. 1) viewable through the front face of the first housing, and the optical module may be disposed to be oriented in a direction parallel to the display at the second position.

According to various example embodiments, the optical module may include a case (e.g., the case 261 in FIG. 8) configured to accommodate at least one electronic component and at least partially exposed outward of the second housing, and at least one rotating shaft (e.g., the rotating shaft 263 in FIG. 8) extending from both ends of the case and rotatably mounted within the second housing.

According to various example embodiments of the disclosure, the elastic member comprises a flexible printed circuit board, and may include a first connector (e.g., the first connector 311 in FIG. 9 or 10) connected to an electronic component inside the case, a first extension (e.g., the first extension 313 in FIG. 9 or 10) extending from the first connector and disposed inside the rotating shaft, a second extension (e.g., the second extension 315 in FIG. 9 or 10) extending from one side of the first extension, at least a portion of the second extension being arranged around the rotating shaft, and a second connector (e.g., the second connector in FIG. 9 or 10) provided at an end of the second extension.

According to various example embodiments, at the second position (e.g., the state illustrated in FIG. 12 or 17), a portion of the second extension is disposed between the rotating shaft and a remaining portion of the second extension to surround a portion of the rotating shaft.

According to various example embodiments, at the first position (e.g., the state illustrated in FIG. 16 or 20), a portion of the second extension is disposed between the front face of the second housing and the rotating shaft, and a remaining portion of the second extension may be disposed between the rear face of the second housing and the rotating shaft.

According to various example embodiments, the electronic device may further include a first slide (e.g., the first slide member 201 in FIG. 7 or 8) mounted in the second housing and slidably coupled to the first housing, and a rotation support (e.g., the rotation support member 205 in FIG. 8) mounted on the first slide. The optical module may include a case at least partially exposed outward of the second housing and a rotating shaft extending from both ends of the case and rotatably mounted on the rotation support.

According to various example embodiments, the electronic device may further include a rack gear (e.g., the rack gear 235 in FIG. 8) provided on a second slide, and a pinion gear (e.g., the pinion gear 265 in FIG. 8) provided at an end of the rotating shaft. When the second slide member slides on the first slide member, the pinion gear is engaged with the rack gear so as to rotate the optical module.

According to various example embodiments, the electronic device may further include a guide stopper (e.g., the guide stopper 202 in FIG. 8) disposed on the first slide and a second slide (e.g., the second slide member 203 in FIG. 8) mounted on the first slide member and coupled to the guide stopper to slide on the first slide member.

According to various example embodiments of the disclosure, the electronic device may further include a first guide hole (e.g., the first guide hole 213 in FIG. 8) provided in the first slide member, a second guide hole (e.g., the second guide hole 233 in FIG. 8) provided in the second slide member and extending in a direction perpendicular to a moving direction of the first slide member (e.g., the first direction L1 or the second direction L2 in FIG. 7), and a first guide protrusion (e.g., the first guide protrusion 223 in FIG. 8) provided on the guide stopper and accommodated in the first guide hole through the second guide hole. The first guide hole 213 may include an inclined section (e.g., the inclined section 213*a* in FIG. 8) extending to be inclined with respect to the first direction L1, and a linear section (e.g., the linear section 213*b* in FIG. 8) extending from one end of the inclined section parallel to the first direction.

According to various example embodiments, while the second housing moves from the first position to the second position, the first guide protrusion may gradually move from the inclined section to the linear section.

According to various example embodiments, the electronic device may further include a fixing member (e.g., the fixing member 204 in FIG. 8) mounted on the second slide member so as to restrain the guide stopper to the second slide member, a third guide hole (e.g., the third guide hole 241 in FIG. 8) formed in the fixing member and extending in a direction perpendicular to the first direction, and a second guide protrusion (e.g., the second guide protrusion 225 in FIG. 8) formed on the guide stopper and accommodated in the third guide hole.

According to various example embodiments, the electronic device may further include a fourth guide hole (e.g., the fourth guide hole 231 in FIG. 8) formed in the second slide and extending in the first direction, and a guide screw (e.g., the guide screw 239 in FIG. 8) mounted on the first slide through the fourth guide hole. While the second housing moves from the first position to the second position, the first guide protrusion may gradually move from the inclined section to the linear section, and when the first guide projection is located in the linear section, the second slide may slide with respect to the first slide together with the guide stopper under the guidance of the fourth guide hole and the guide screw.

According to various example embodiments, the electronic device may further include a driven member (e.g., the driven member 295 in FIG. 7) mounted on the first slide member, a lead screw (e.g., the lead screw 293 in FIG. 7) screwed to the driven member, and a driving motor (e.g., the driving motor 291 in FIG. 7) mounted in the first housing and configured to rotate the lead screw.

According to various embodiments, the electronic device may further include a rotation stopper (e.g., the rotation stopper 267 in FIG. 8) protruding from an outer circumferential face of the rotating shaft, and a rotation hole (e.g., the rotation hole 251 in FIG. 8) provided in the rotation support to accommodate the rotating shaft, and a rotation guide groove (e.g., the rotation guide groove 253 in FIG. 8) provided in the outer circumferential face of the rotation support around the rotation hole. The rotation guide groove may limit the moving range of the rotation stopper or the rotating range of the optical module by accommodating the rotation stopper.

According to various example embodiments, an electronic device (e.g., the electronic device 100 or 200 in FIG. 1 or 7) according to various embodiments may include: a first housing (e.g., the first housing 110 in FIG. 1 or 7) having a display (e.g., the display 101 in FIG. 1 or 7) viewable through a front face of the first housing; a second housing (e.g., the second housing 104 in FIG. 1 or 7) coupled to the first housing and configured to slide between a first position (e.g., the position illustrated in FIG. 3 or 4) at which the second housing is accommodated in the first housing and a second position (e.g., the position illustrated in FIG. 5 or 6) at which the second housing protrudes from the first housing in a first direction (e.g., the first direction L1 in FIG. 7) or in a direction opposite the first direction (e.g., the second direction L2 in FIG. 7) with respect to the first housing; an optical module comprising optical circuitry (e.g., the optical module 105 in FIG. 1 or 7) mounted on the second housing and configured to rotate in response to the sliding of the second housing to be disposed to face the rear side of the first housing at the first position and to be disposed parallel to the display to face the front side of the first housing at the second position, the optical module including a case (e.g., the case 261 in FIG. 8) at least partially exposed outward of the second housing and rotating shafts (e.g., the rotating shaft 263 in FIG. 8) extending from both ends of the case and rotatably mounted in the second housing; and a flexible printed circuit board (e.g., the flexible printed circuit board 301*a* or 301*b* in FIG. 9 or 10). The flexible printed circuit board may include a first connector disposed inside the case, a first extension extending from the first connector and disposed inside of the rotating shaft, and a second extension extending from one side of the first extension wherein at least a portion of the flexible printed circuit board is arranged around the rotating shaft. When the second housing is configured to slide from the second position to the first position, the second extension may provide an elastic force in the rotating direction of the optical module (e.g., the first rotating direction R1 in FIG. 12 or 13).

According to various example embodiments, at the second position, a portion of the second extension is disposed between the rotating shaft and a remaining portion of the second extension so as to surround a portion of the rotating shaft, thereby accumulating the elastic force.

According to various example embodiments, at the second position, the second extension may be at least partially arranged to form a letter "S" shape, and at the first position, the second extension may be at least partially arranged to form a letter "U" shape.

According to various example embodiments, the electronic device may further include: a first slide mounted in the second housing and slidably coupled to the first housing; a second slide mounted on the first slide and configured to slide with respect to the first housing together with the first slide in a first section, and to slide with respect to the first slide in a second section; a rack gear provided on the second slide; and a pinion gear provided on the rotating shaft to be engaged with the rack gear. In the second section, the optical module may be rotated by the rack gear and the pinion gear.

According to various example embodiments, as the second housing gradually approaches the second position in the second section, a portion of the second extension gradually enters a space between the rotating shaft and the remaining portion of the second extension.

While the disclosure has been illustrated and described with reference to various example embodiments thereof, it will be understood by those skilled in the art that various changes in form and details may be made therein without departing from the spirit and scope of the disclosure, including the appended claims and equivalents thereof

What is claimed is:

1. An electronic device comprising:
   a first housing;
   a second housing coupled to the first housing and configured to slide in a first direction or
   in a second direction opposite the first direction with respect to the first housing between a first position at which at least a portion of the second housing is accommodated in the first housing and a second position at which the second housing protrudes from the first housing;
   an optical module comprising optical circuitry mounted on the second housing, the optical module configured to rotate in response to and during sliding of the second housing to be disposed to face a rear side of the first housing at the first position and to face a front side of the first housing at the second position; and
   an elastic member comprising a flexible elastic material accommodated in the second housing and configured to provide an elastic force to the optical module.

2. The electronic device of claim 1, wherein the elastic member is configured to provide the elastic force in the rotating direction of the optical module in a first operation in which the optical module rotates in a first direction while the second housing slides from the first position to the second position or in a second operation in which the optical module rotates in a second direction while the second housing slides from the second position to the first position.

3. The electronic device of claim 1, wherein the optical module includes at least one of a camera, an infrared projector, a light-emitting device, or an illuminance sensor.

4. The electronic device of claim 1, further comprising:
   a display viewable through a front face of the first housing,
   wherein the optical module is disposed to be oriented in a direction parallel to the display at the second position.

5. The electronic device of claim 1, wherein the optical module includes:
   a case accommodating at least one electronic component and at least partially exposed outward of the second housing; and
   rotating shafts extending from both ends of the case and rotatably mounted within the second housing.

6. The electronic device of claim 5, wherein the elastic member comprises a flexible printed circuit board and includes:
   a first connector connected to the electronic component inside the case;
   a first extension extending from the first connector and disposed inside a first one of the rotating shafts;
   a second extension extending from one side of the first extension, at least a portion of the second extension being arranged around the first rotating shaft; and
   a second connector provided at an end portion of the second extension.

7. The electronic device of claim 6, wherein, at the second position, a portion of the second extension is disposed between the first rotating shaft and a remaining portion of the second extension to surround a portion of the first rotating shaft.

8. The electronic device of claim 6, wherein, at the first position, a portion of the second extension is disposed between a front face of the second housing and the first rotating shaft, and a remaining portion of the second extension is disposed between a rear face of the second housing and the first rotating shaft.

9. The electronic device of claim 1, further comprising:
   a first slide mounted in the second housing and slidably coupled to the first housing; and
   a rotation support mounted on the first slide,
   wherein the optical module includes a case at least partially exposed outward of the second housing and a rotating shaft extending from both ends of the case and rotatably mounted on the rotation support.

10. The electronic device of claim 9, further comprising:
    a second slide mounted in the second housing and slidably coupled to the first housing;
    a rack gear provided on the second slide; and
    a pinion gear provided at an end of the rotating shaft,
    wherein, based on the second slide member sliding on the first slide, the pinion gear is engaged with the rack gear to rotate the optical module.

11. The electronic device of claim 10, further comprising:
    a guide stopper disposed on the first slide, wherein the second slide is coupled to the guide stopper.

12. The electronic device of claim 11, further comprising:
    a first guide hole provided in the first slide;
    a second guide hole provided in the second slide and extending in a direction perpendicular to a moving direction of the first slide; and a first guide protrusion provided on the guide stopper and accommodated in the first guide hole through the second guide hole, wherein first guide hole includes an inclined section extending to be inclined with respect to the first direction, and a linear section extending from one end of the inclined section parallel to the first direction.

13. The electronic device of claim 12, wherein, based on the second housing moving from the first position to the second position, the first guide protrusion is configured to move from the inclined section to the linear section.

14. The electronic device of claim 12, further comprising:
a fixing member mounted on the second slide and configured to restrain the guide stopper to the second slide;
a third guide hole provided in the fixing member and extending in a direction perpendicular to the first direction; and
a second guide protrusion provided on the guide stopper and accommodated in the third guide hole.

15. The electronic device of claim 12, further comprising:
a third guide hole provided in the second slide and extending in the first direction; and
a guide screw mounted on the first slide through the third guide hole,
wherein, based on the second housing moving from the first position to the second position, the first guide protrusion is configured to move from the inclined section to the linear section, and
based on the first guide projection being located in the linear section, the second slide is configured to slide with respect to the first slide together with the guide stopper under guidance of the third guide hole and the guide screw.

16. The electronic device of claim 9, further comprising:
a driven member mounted on the first slide;
a lead screw screwed to the driven member; and
a driving motor mounted in the first housing and configured to rotate the lead screw.

17. An electronic device comprising:
a first housing including a display viewable through a front face thereof;
a second housing coupled to the first housing and configured to slide in a first direction or in a second direction opposite the first direction with respect to the first housing between a first position at which at least a portion of the second housing is accommodated in the first housing and a second position at which the second housing protrudes from the first housing;
an optical module comprising optical circuitry mounted on the second housing and configured to rotate in response to the sliding of the second housing to be disposed to face the rear side of the first housing at the first position and to be disposed parallel to the display to face the front side of the first housing at the second position, the optical module including a case at least partially exposed outward of the second housing and rotating shafts extending from both ends of the case and rotatably mounted in the second housing; and
a flexible printed circuit board,
wherein the flexible printed circuit board includes:
a first connector disposed inside the case;
a first extension extending from the first connector and disposed inside the rotating shaft; and
a second extension extending from one side of the first extension, at least a portion of the second extension being arranged around the rotating shaft, and
wherein, based on the second housing sliding from the second position to the first position, the second extension is configured to provide an elastic force in a rotating direction of the optical module.

18. The electronic device of claim 17, wherein, at the second position, a portion of the second extension is disposed between the rotating shaft and a remaining portion of the second extension to surround a portion of the rotating shaft.

19. The electronic device of claim 17, wherein, at the second position, the second extension is at least partially arranged to form an "S" shape, and at the first position, the second extension is at least partially arranged to form a "U" shape.

20. The electronic device of claim 17, further comprising:
a first slide mounted in the second housing and slidably coupled to the first housing;
a second slide mounted on the first slide and configured to slide with respect to the first housing together with the first slide in a first section, and to slide with respect to the first slide in a second section;
a rack gear provided on the second slide; and
a pinion gear provided on the rotating shaft and configured to be engaged with the rack gear,
wherein, in the second section, the optical module is configured to be rotated by the rack gear and the pinion gear.

* * * * *